(12) United States Patent
Whetsel

(10) Patent No.: US 6,378,093 B1
(45) Date of Patent: Apr. 23, 2002

(54) CONTROLLER FOR SCAN DISTRIBUTOR AND CONTROLLER ARCHITECTURE

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/248,504

(22) Filed: Feb. 10, 1999

Related U.S. Application Data

(60) Provisional application No. 60/074,264, filed on Feb. 10, 1998.

(51) Int. Cl.$^7$ ................................................ G01R 31/28
(52) U.S. Cl. ....................................................... 714/726
(58) Field of Search ................................ 714/726, 727, 714/729, 731, 30, 724; 712/227

(56) References Cited

U.S. PATENT DOCUMENTS

| | | | | |
|---|---|---|---|---|
| 6,073,254 A | * | 6/2000 | Whetsel | 714/30 |
| 6,158,034 A | * | 12/2000 | Ramamurthy et al. | 714/727 |
| 6,163,864 A | * | 12/2000 | Bhavsar et al. | 714/727 |
| 6,279,103 B1 | * | 8/2001 | Warren | 712/227 |

* cited by examiner

*Primary Examiner*—Christine T. Tu
(74) *Attorney, Agent, or Firm*—Lawrence J. Bassuk; W. James Brady; Frederick J. Telecky, Jr.

(57) ABSTRACT

Functional circuits and cores of circuits are tested on integrated circuits using scan paths. Using parallel scan distributor and collector circuits for these scan paths improves test access of circuits and cores embedded within ICs and reduces the IC's power consumption during scan testing. A controller for the distributor and collector circuits includes a test control register, a test control state machine and a multiplexer. These test circuits can be connected in a hierarchy or in parallel. A conventional test access port or TAP can be modified to work with the disclosed test circuits.

12 Claims, 20 Drawing Sheets

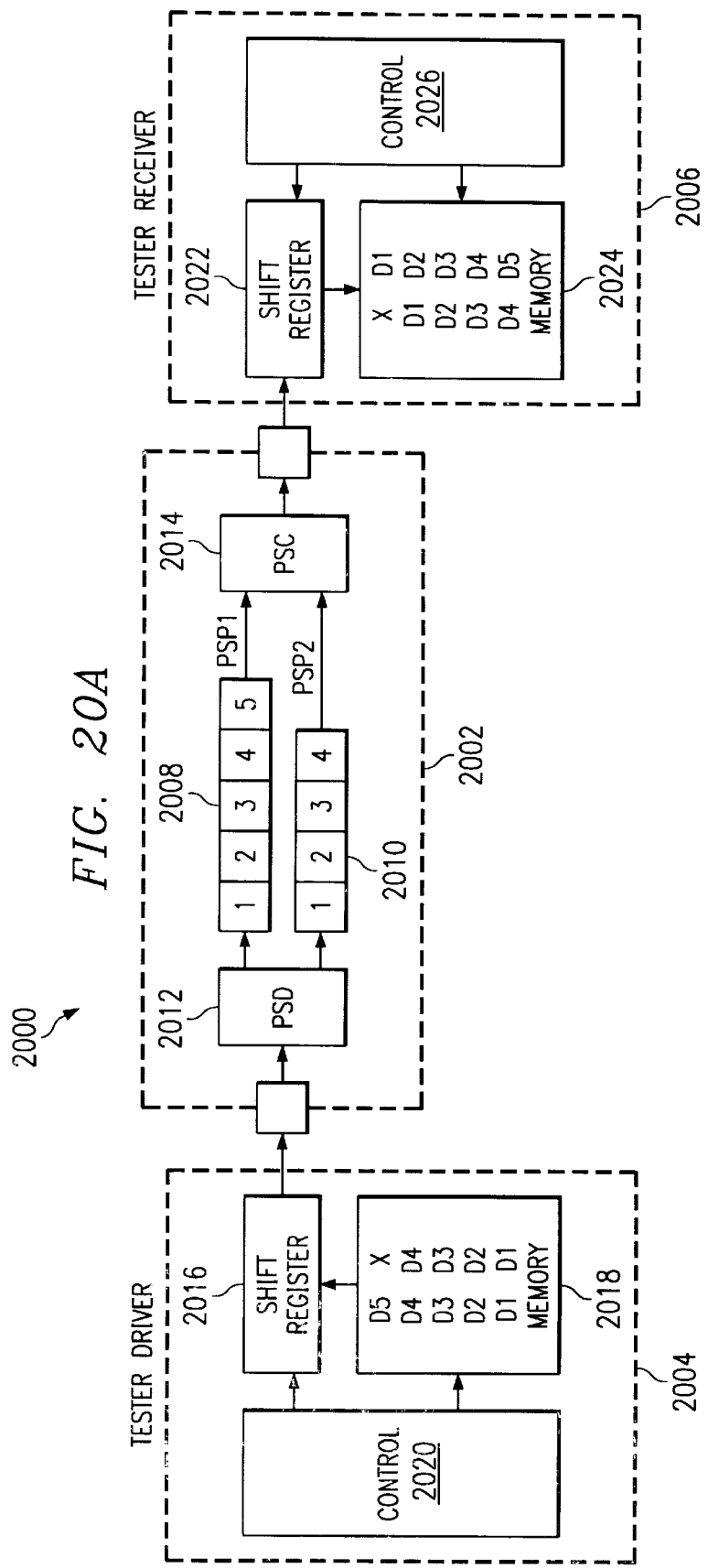

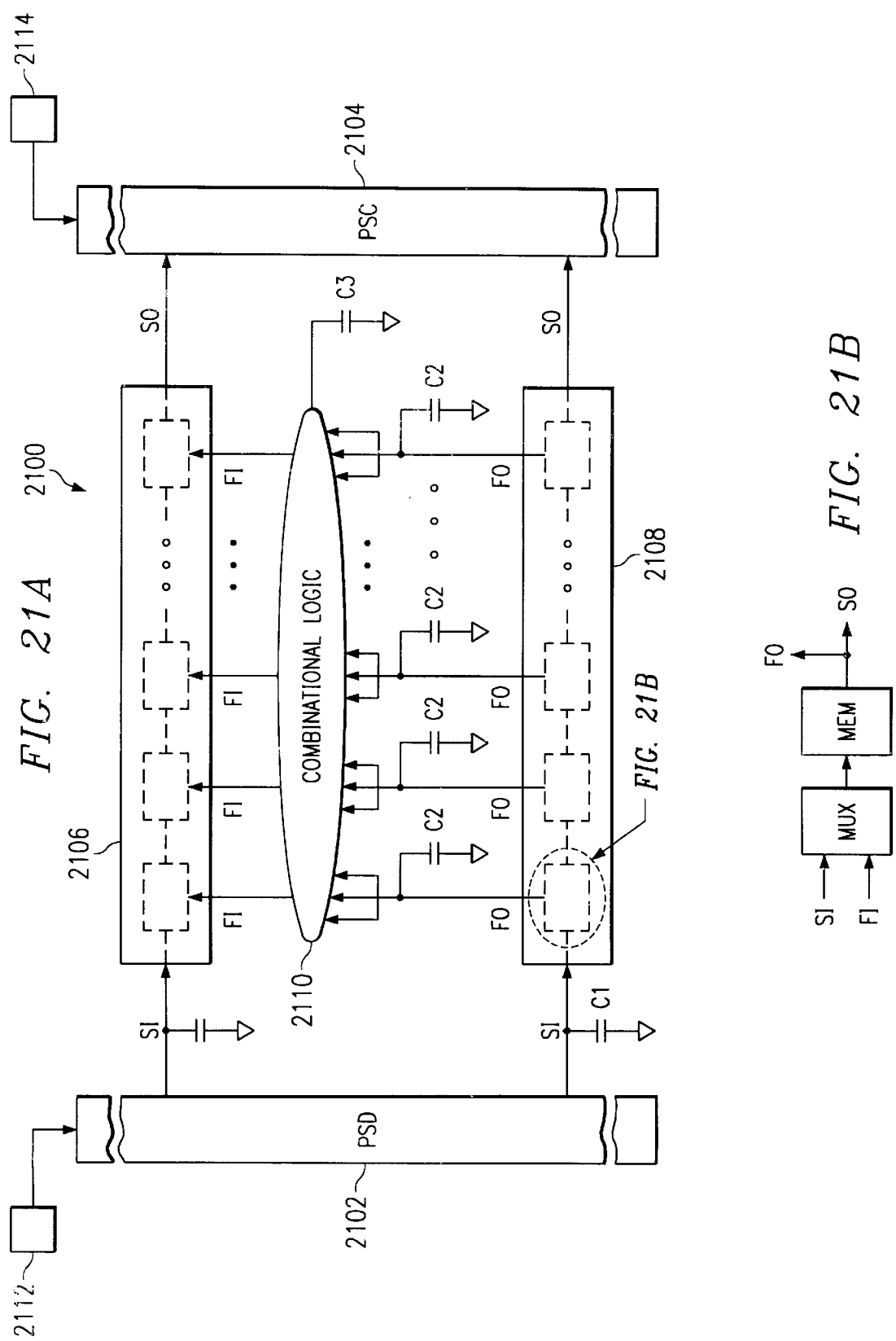

CONTROLLER FOR SCAN DISTRIBUTOR AND CONTROLLER ARCHITECTURE

This application claims priority under 35 USC § 119(e)(1) of provisional application No. 60/074,264, filed Feb. 10, 1998.

BACKGROUND OF THE INVENTION

1. Field of the Invention

This invention relates generally to testing of integrated circuits with scan paths and particularly relates to testing integrated circuits with parallel scan distributors and collectors controlled by a controller that includes a state machine.

2. Description of the Related Art

Cost effective testing of today's complex integrated circuits is extremely important to semiconductor manufacturers from a profit and loss standpoint. The increases in complexity of state-of-the-art integrated circuits is being accompanied by an ever increasing difficulty to test the integrated circuits. New test techniques must be developed to offset this increasing integrated circuit test cost, otherwise further advancements in future integrated circuit technology may be blocked. One emerging technology that is going to accelerate the complexity of integrated circuits even more is intellectual property cores. These cores will provide highly complex pre-designed circuit functions such as; DSPs, CPUs, I/O peripherals, memories, and mixed signal A/D and D/A functions. These cores will exist in a library and can be selected and placed in an integrated circuit quickly to provide a complex circuit function. The low cost testing of integrated circuits that contain highly complex core functions will be a significant challenge

SUMMARY OF THE INVENTION

The disclosed circuits provide a description of a controller for use with the parallel scan distributor and collector circuits. The controller has a test control register, a test control state machine and a multiplexer. The controller also has inputs and outputs for connection to additional controllers in a hierarchical or parallel arrangement. The controller is also programmable to provide different types of test control for testing different types of circuits.

The disclosed parallel scan distributor and collector circuits provide a low power method of scan testing combinational logic within an IC by allowing scan test communication to occur over a larger number of shorter length scan paths.

With a synchronizer and delay circuit, the disclosed test circuits can further reduce the power needed to test the integrated circuits. The test circuits disclosed can be used to test functional combinatorial logic, random access memory, and digital to analog and analog to digital circuitry. Conventional IEEE 1149.1 test access port or TAP circuits can be modified to operate with the disclosed scan distributor and collectors circuits and controllers.

BRIEF DESCRIPTION OF THE VIEWS OF THE DRAWINGS

FIGS. 20A and 20B are block diagrams of integrated circuits under test and test drivers and receivers.

FIGS. 21A and 21B are block diagrams of scan path circuits and representations of capacitive loadings.

FIG. 23A-1 is a block diagram of a random access memory device including parallel scan distributor and collector circuits.

FIG. 23A-2 is a flow chart of states used to test a random access memory device.

FIG. 23B-1 is a block diagram of a digital to analog converter including parallel scan distributor circuits.

FIG. 23B-2 is a flow chart of states used to test a digital to analog converter.

FIG. 23C-1 is a block diagram of an analog to digital converter including parallel scan collector circuits.

FIG. 23C-2 is a flow chart of states used to test an analog to digital converter.

DETAILED DESCRIPTION

Figure 1:
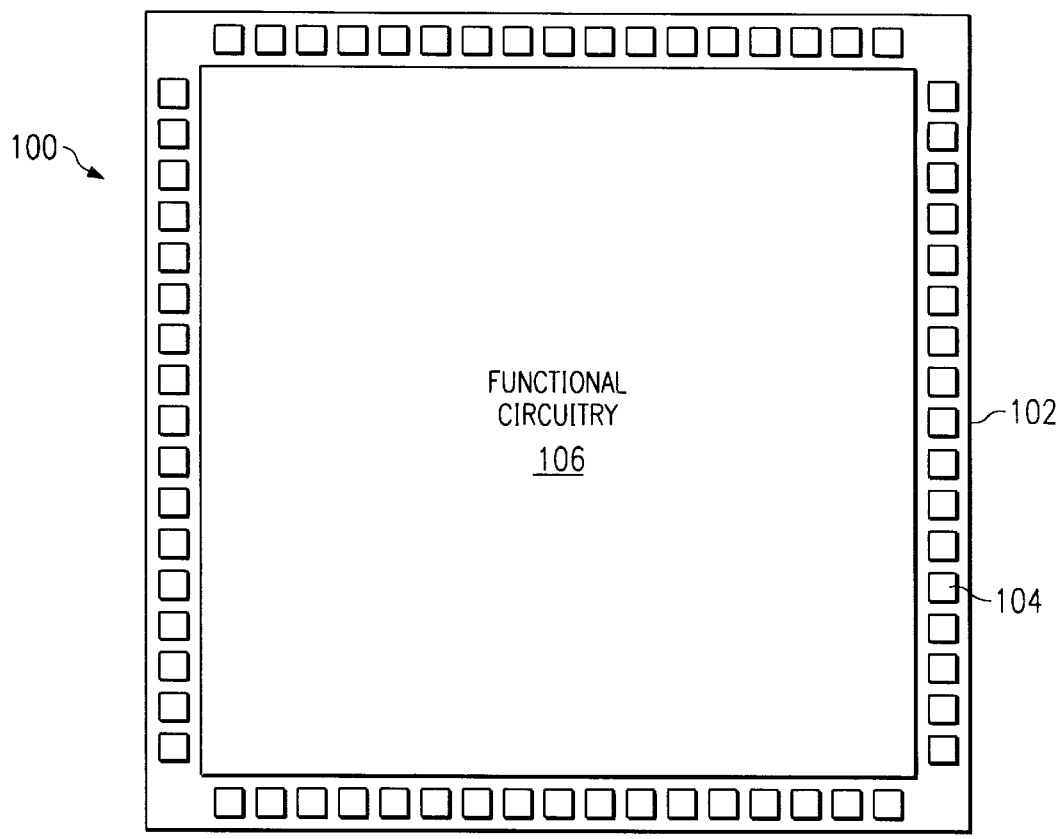
FIG. 1 depicts an integrated circuit.

In FIG. 1, integrated circuit 100 comprises a semiconductor substrate 102 with bond pads 104 and functional circuitry 106. To expedite testing, an integrated circuit's functional circuitry 106 can be arranged into many parallel scan paths, each scan path having a serial data input and serial data output. Having many short parallel scan paths, versus one long continuous scan path, is preferred since it reduces the time it takes to shift test data in and out. Each parallel scan path's serial data input and output can be connected to a bond pad 104 to allow a tester to input test data to and output test data from all scan paths concurrently. Parallel scan design references include FIG. 18-3 of Chapter 18 of 1990 IEEE Publication "The Test Access Port and Boundary Scan Architecture" by Colin Maunder, and FIG. 14a of U.S. Pat. No. 5,526,365 to Whetsel.

Figure 2:
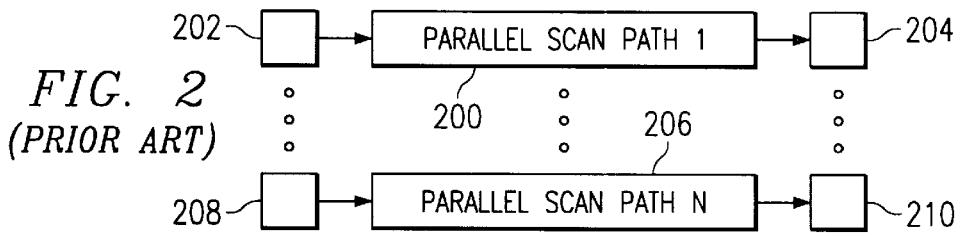
FIG. 2 is a block diagram of a known parallel scan path test arrangement.

In FIG. 2, known parallel scan path 200 has a serial data input at pad 202 and a serial data output at pad 204. Known parallel scan path N 206 has a serial data input at pad 208 and a serial data output at pad 210. In the circuits of FIG. 2, N scan paths will require use of 2×N bond pads for serial data input and serial data output. While some bond pads will be used to supply control to the scan paths and for power and ground, a majority of the bond pads may be used for scan path serial data input and output. The number of available bond pad pairs will limit the number of scan paths that can be accessed in parallel.

The scan cycle time of the conventional scan path arrangement of FIG. 2 can be expressed by (L+1)T, where L is the scan path length through which stimulus and response test patterns are shifted during each scan cycle, 1 is the capture step required to input response data from the functional logic under test into the scan path, and T is the period of the scan clock. Using this equation, for example, the scan cycle time for a scan path having a length (L) of 1000 bits is (1000+1)T, or 1001T. The test time equals "scan cycle time" times "the number of test patterns".

Figure 3:
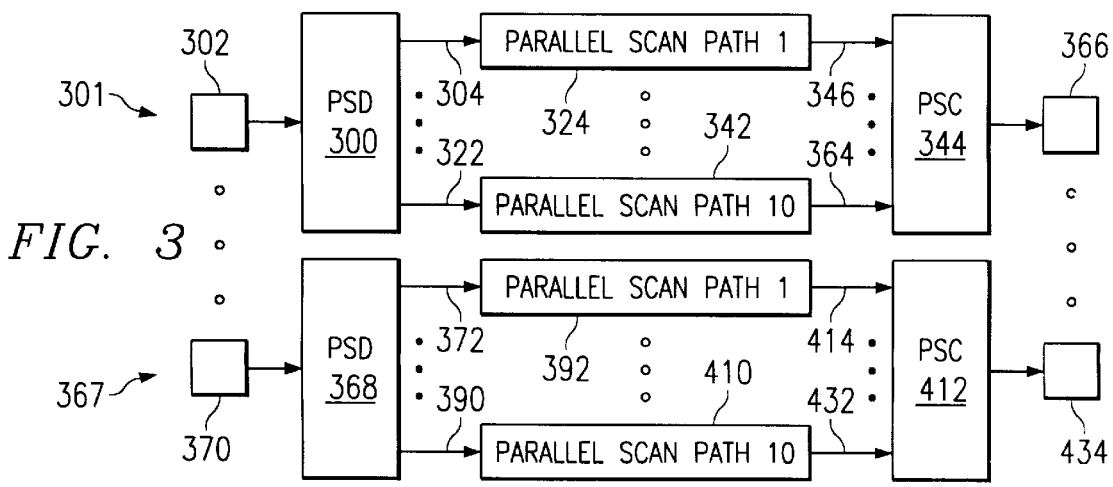
FIG. 3 is a block diagram of a parallel scan path test arrangement according to the present invention.

In FIG. 3, scan test circuit 301 includes a scan distributor 300, scan paths 324 through 342 and scan collector 344. Parallel scan distributor circuit 300 forms a data input amplification circuit connected between bond pad 302 and data inputs 304 through 322 to ten plural scan paths 324 through 342, of which only the first and last are depicted for clarity of the drawing. Parallel scan collector circuit 344 forms an output amplification circuit connected between the data outputs 346 through 364 of plural scan paths 324 through 342 and bond pad 366.

Scan test circuit 367 includes a scan distributor 368, scan paths 392 through 410 and scan collector 412. In a like manner, parallel scan distributor circuit 368 forms a data input amplification circuit connected between bond pad 370 and data inputs 372 through 390 to ten plural scan paths 392 through 410, of which only the first and last are depicted for clarity of the drawing. Parallel scan collector circuit 412 forms an output amplification circuit connected between the data outputs 414 through 432 of plural scan paths 392 through 410 and bond pad 434.

Scan paths 324 through 342 form one group of scan paths connected between scan distributor circuit 300 and scan collector circuit 344. Scan paths 392 through 410 form another group of scan paths connected between scan distributor circuit 368 and scan collector circuit 412.

In FIG. 3, the parallel scan distributor provides a data input amplification circuit located between a bond pad and data inputs to plural scan paths. The parallel scan collector provides a data output amplification circuit located between the data outputs of the plural scan paths and a bond pad. This is different from the conventional parallel scan path arrangement depicted in FIG. 2 in which each scan path's data input is directly connected to a bond pad and each scan path's data output is directly connected to a bond pad. Therefore, the data amplification capability of the present invention is understood by comparing FIG. 2 and FIG. 3.

The conventional parallel scan path arrangement of FIG. 2 thus is modified by the insertion of parallel scan distributor circuits and parallel scan collector circuits. The scan distributor circuits 300, 368 are basically serial-input parallel-output shift registers, and the scan collector circuits 344, 434 are basically parallel-input serial-output shift registers. While the parallel input and output width of the scan distributor and collector circuits can be of any bit width, the distributor and collector circuits 300, 344, 368 and 412 have 10 bit wide parallel inputs and outputs that provide one bit input and output to the respective parallel scan paths.

The scan input modifications of the FIG. 2 arrangement include: (1) disconnecting the bond pads from scan paths 1–N, (2) inserting the scan distributor circuits, (3) connecting the bond pads to the serial inputs of the scan distributor circuits, and (4) connecting each parallel output of the scan distributor circuits to a respective input of the scan paths. The scan output modifications of the FIG. 2 arrangement include: (1) disconnecting the bond pads from scan paths 1–N, (2) inserting the scan collector circuits, (3) connecting the bond pads to the serial outputs of the scan collector circuits, and (4) connecting the output of each scan path to a respective parallel input of the scan collector circuits.

The scan path modifications of the FIG. 2 arrangement include: (1) dividing each scan path 1–N into a group of individual shorter length scan paths, each preferably being of equal length, and in which the number of individual scan paths of each group equals to the number of parallel inputs and outputs (10) of the scan distributor and scan collector circuits, (2) connecting the serial data input of each scan path of each group to a parallel output of a respective scan distributor circuit, and (3) connecting the serial data output of each scan path of each group to a parallel input of a respective scan collector circuit.

With 10 bit deep scan distributor and collector circuits, the number of individual scan paths in each group is equal to ten. If the scan paths 200 and 206 of FIG. 2 were each 1000 bits long, the above partitioning would convert each 1000 bit scan path into a group of ten 100 bit scan paths.

Figure 4:
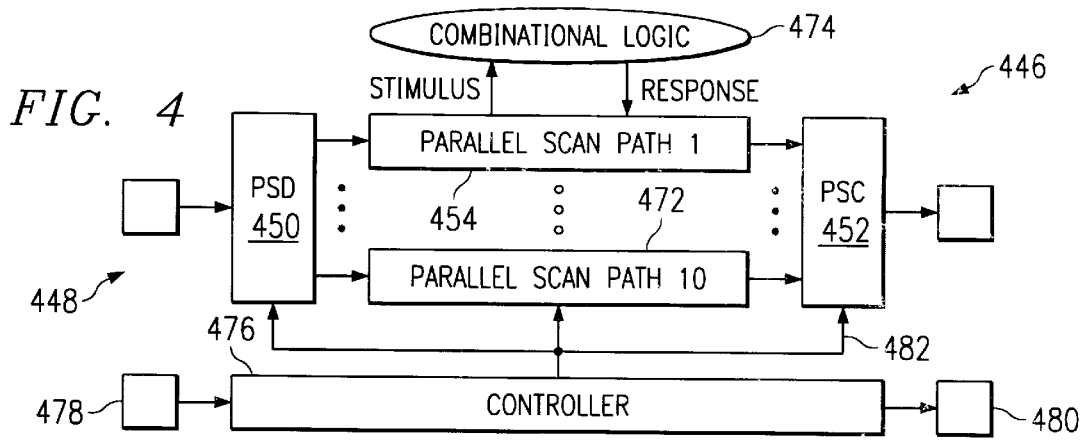
FIG. 4 is a block diagram of the scan path test arrangement of FIG. 3 further including a test controller according to the present invention.

In FIG. 4, integrated circuit 446 includes scan test circuits 448. One scan distributor 450 and scan collector 452 pair provide access to 10 parallel scan paths 454 through 472. Each of the 10 parallel scan paths connects to combinational logic 474 in functional circuitry 106. The combinational logic 474 is tested by inputting test stimulus and outputting test response through the parallel scan paths 454 through 472. While stimulus input and response output connections are shown only between combinational logic 474 and parallel scan path 1 454, all ten of the parallel scan paths 454 through 472, respectively, are similarly connected to combinational logic 474.

A controller 476 connects to the scan distributor circuit 450, parallel scan paths 1–10 454 through 472 and scan collector 452, as well as all other scan distributors, parallel scan paths, and scan collectors in the integrated circuit by leads 482. Controller 476 controls the test operation of the scan distributor circuits, parallel scan paths 1–10 454 through 472 and scan collector 452, as well as all other scan distributors, parallel scan paths, and scan collectors in the integrated circuit. The controller 476 connects to bond pads 478 and 480 for access and control by a source external to the integrated circuit, such as a wafer or integrated circuit tester.

When the integrated circuit's functional circuitry is configured for testing, all functional registers (flip/flops or latches) in the integrated circuit are converted into scan registers that form the parallel scan paths shown. Also, during test configuration, all combinational logic in the integrated circuit that was associated with the functional registers remains associated with the scan registers after the conversion. This conversion of an integrated circuit's functional circuitry into scan paths and combinational logic is well known.

The combinational logic 474 is tested by receiving test stimulus data from the parallel scan paths 454 through 472 and outputting test response data to the parallel scan paths 454 through 472. The test stimulus data applied to the combinational logic 474 from the parallel scan paths is input to the parallel scan paths via the scan distributor 450. The test response data received into the parallel scan paths from the combinational logic is output from the parallel scan paths via the scan collector 452. During test, the controller 476 operates the scan distributor 450, parallel scan paths 454–472, and scan collector 452 to test the combinational logic 474. Simultaneous with this test, the controller 476 also operates other scan distributors, parallel scan paths, and scan collectors of the integrated circuit to test further combinational logic within the integrated circuit.

Figure 5:
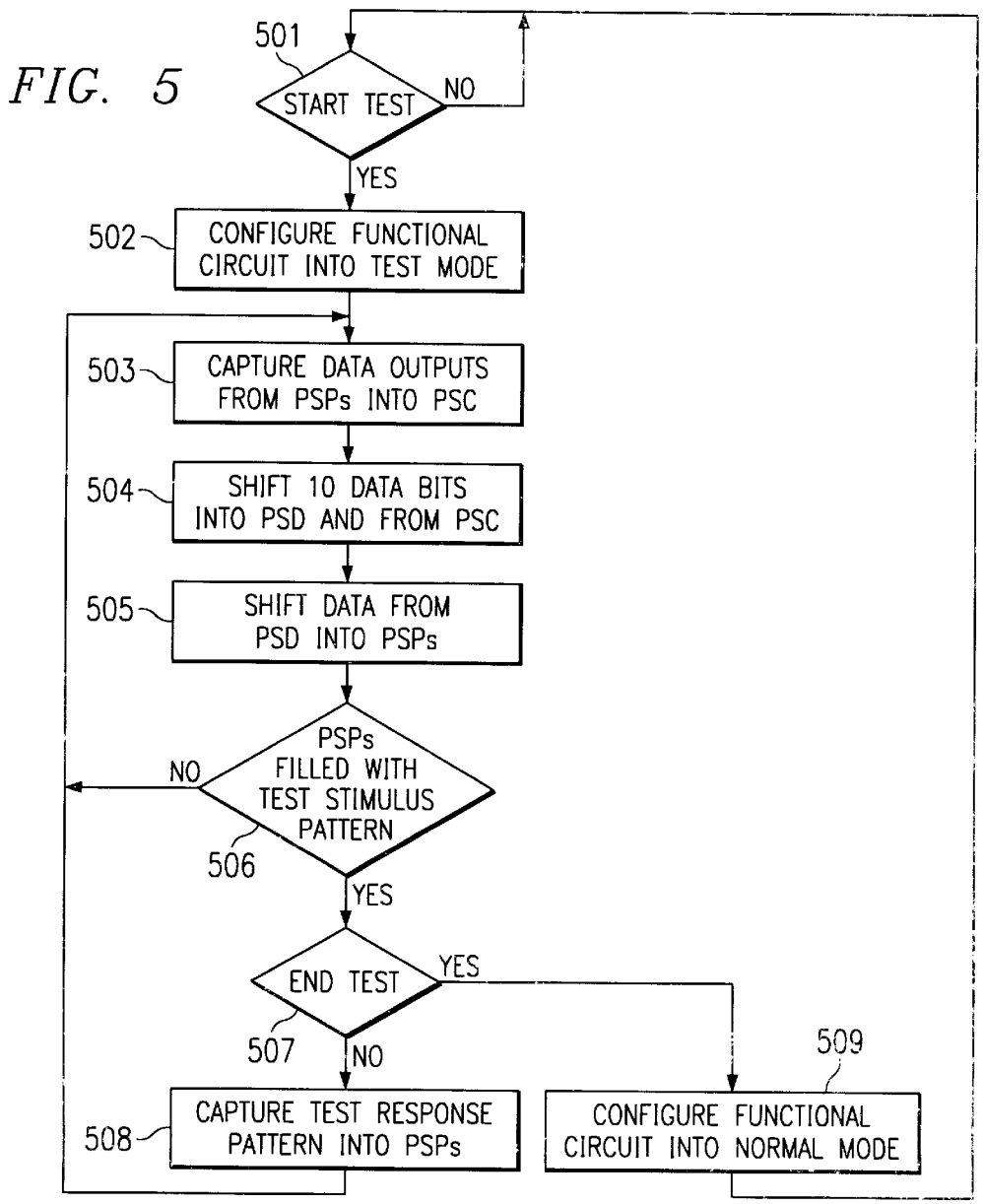
FIG. 5 is a flow chart illustrating operation of the test controller and scan path arrangement of FIG. 4.

In FIG. 5, the flow chart illustrates one example of the controller operating the scan distributor, parallel scan paths, and scan collector of FIG. 4 during testing of the integrated circuit's combinational logic. Initially, the controller will be in the start test state waiting for a signal to start testing. In response to a start test signal, the controller executes the following steps. The step numbers correspond to the state numbers in the diagram of FIG. 5.

| Step Number | Operation |
| --- | --- |
| 501 | Test to see if start test has occurred. No, goto 501. Yes, goto 502. |
| 502 | Configure functional circuitry into test mode, goto 503 |
| 503 | Capture response data outputs from all parallel scan paths (PSPs) into scan collector (PSC), goto 504 |
| 504 | Shift scan distributor and collector ten times to load stimulus data into distributor and unload response data from collector, goto 505 |
| 505 | Shift scan paths one time to load scan paths with test stimulus data from scan distributor, goto 506 |
| 506 | Test to see if parallel scan paths (PSPs) have filled with the test stimulus pattern No, goto 503 Yes, goto 507 |
| 507 | Test to see if end of test has occurred No, goto 508 Yes, goto 509 |
| 508 | Capture response pattern from combinational logic into parallel scan paths (PSPs), goto 503 |
| 509 | End of test, configure IC circuitry into normal mode, goto 501 |

Following the end of test step 507, the test is complete and the controller configures the functional circuitry back into its normal mode, then goes to and remains in the start test state 501 until another start test signal occurs. During the test, a tester supplies stimulus data to the scan paths via the serial to parallel operation of the scan distributors, and receives response data from the scan paths via the parallel to serial operation of the scan collectors. The tester compares the response data it receives from the scan collectors to expected response data to determine if the test passes or fails. Alternately, during test the tester may compress the response data it receives from the scan collectors into signatures and then compare the signatures at the end of test to expected signatures.

Figure 6:
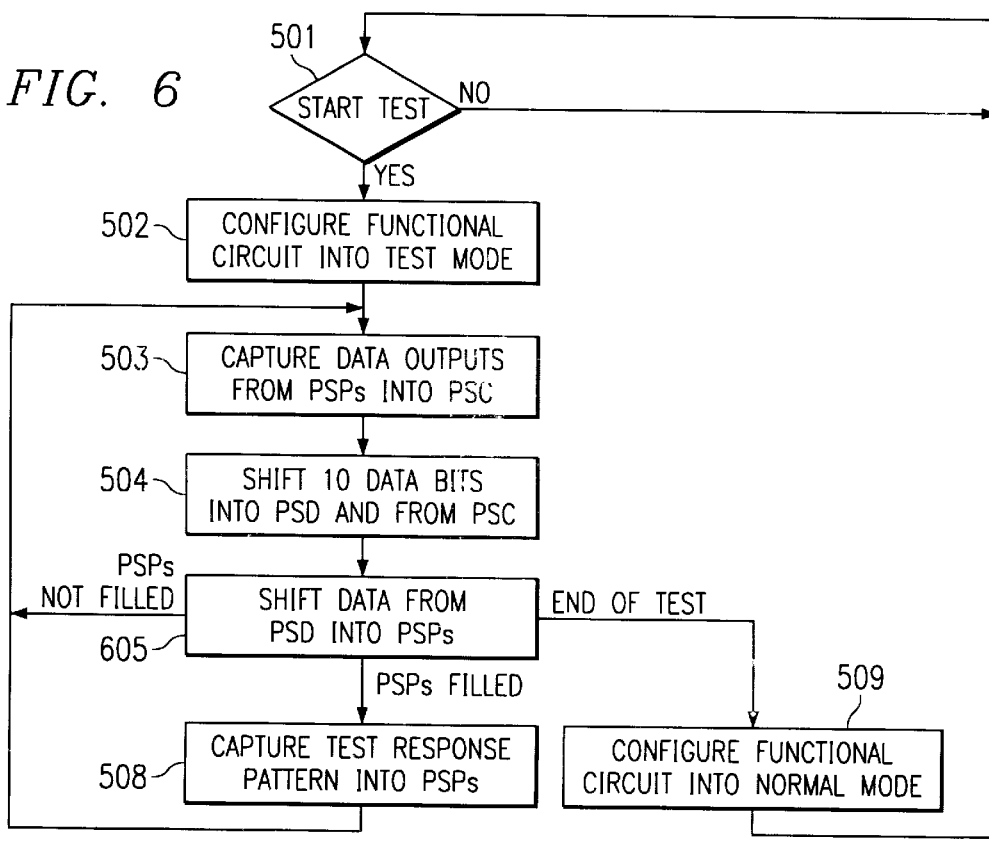
FIG. 6 is a flow chart illustrating an alternate operation of the test controller and scan path arrangement.

In FIG. 6, an example of another controller flow chart illustrates how the decision states 506 and 507 of FIG. 5 may be merged into state 605 of FIG. 6 to streamline the test execution flow. In FIG. 6, state 605 executes the shift operation that moves data from the scan distributors into the scan paths, then executes decision states to determine whether the next state will be state 503, 508, or 509. Merging the decision states into state 605 is possible because the decisions regarding the full/not full status of the scan paths and the end of test are easily predictable conditions.

| Step Number | Operation |
| --- | --- |
| 501 | Test to see if start test has occurred No, goto 501 Yes, goto 502 |
| 502 | Configure IC circuitry into test mode, goto 503 |
| 503 | Capture response data outputs from all parallel scan paths into scan collectors, goto 504 |
| 504 | Shift scan distributors & scan collectors ten times to load stimulus data into scan distributors and unload response data from scan collectors, goto 605 |
| 605 | Shift scan paths one time to load scan paths with test stimulus data from scan distributors, then If scan path is not filled, goto 503 If scan path is filled & not end of test, goto 508 If scan path is filled & end of test goto 509 |
| 508 | Capture response pattern from combinational logic into scan paths, goto 503 |
| 509 | Configure IC circuitry into normal mode, goto 501 |

While the test data input and output bandwidth of the scan paths 454 through 472 is reduced by the serial to parallel translation in scan distributor 450 and parallel to serial translation in scan collector 452 that occurs for each datum shifted into and out of the parallel scan paths. The overall test time however is comparable to the conventional parallel scan test times for the circuits of FIG. 2. The reason for this is that scan distributor and scan collector circuits enable test data to be communicated to a larger number of shorter length parallel scan paths, whereas the conventional parallel scan arrangement of FIG. 2 communicates test data to a lesser number of longer length scan paths.

The scan cycle time of the scan distributor and scan collector arrangement of FIG. 4, using the FIG. 6 controller operation steps, can be expressed by equation $((D+2)L+1)T$, where: $(D+2)$ is the scan depth (D) of the scan distributor and scan collector circuits shifted, step 504; plus 2, the shifting of data between scan distributor and scan paths in step 605, and between scan collector and scan paths in step 503; L is the scan path length through which data is shifted during each scan cycle; plus 1, the capture step 508 required to input data from the combinational logic into the scan paths; and T is the period of the scan clock.

For the purpose of illustrating a comparison of the scan cycle times between the conventional path arrangement of FIG. 2 and the scan distributor and scan collector scan path arrangement of FIG. 4, the L in the scan distributor and scan collector scan cycle time equation above can be expressed in terms of the L in the conventional scan cycle time equation. As previously described in regard to FIG. 3, a conventional scan path having a length (L) can be converted into a group of ten individual scan paths each having a length of L/10, when using 10 bit scan distributor and scan collector circuits. Converting the original conventional scan path of FIG. 2 into an equivalent scan distributor and scan collector scan path arrangement does not modify the stimulus and response connections to the combinational logic, it simply partitions the single conventional scan paths into an equivalent group of shorter length scan paths. Therefore, for the purpose of comparing scan cycle times between the conventional scan path arrangement of FIG. 2 and a converted, but equivalent, stimulus and response connection, scan distributor and scan collector scan path arrangement of FIG. 4, L/10 is substituted for L in the scan distributor and scan collector scan cycle time equation above.

This results in a scan distributor and scan collector scan cycle time equation of: ((D+2)(L/10)+1)T, or ((10+2)(L/10)+1)T, or (1.2L+1)T, where: L equals the bit length of the original scan path of FIG. 2, and D equals the depth (i.e. 10 bits) of the scan distributor and scan collector circuits. Substituting L=1000 into the conventional scan path equation, (L+1)T, of FIG. 2 and scan distributor and scan collector equation, (1.2L+1)T, above, results in 1001T and 1201T, respectively. In comparing 1001T to 1201T, it is seen that the conversion of the conventional scan path arrangement into an equivalent scan distributor and scan collector scan path arrangement only extends the scan cycle time by approximately 16.6%, in this example.

The scan distributor and scan collector scan cycle time advantageously approaches the conventional scan test time as the depth of the scan distributor and scan collector circuits increase, since test data may be communicated to a larger number of shorter length parallel scan paths. For example, with 40 bit deep scan distributor and scan collector circuits connected to forty 25 bit scan paths, converted from the FIG. 2 scan path as described above, the scan distributor and scan collector scan cycle time becomes (40+2)(L/40)+1)T, or (1.05L+1)T, which extends the scan cycle time by approximately 4.7% compared to the conventional scan cycle time. For identical combinational logic being tested, the number of scan cycles required to apply the test patterns is the same for both the scan distributor and scan collector and conventional scan path arrangements. The integrated circuit test time will therefore be extended in proportion to the scan cycle time extension.

Figure 7:
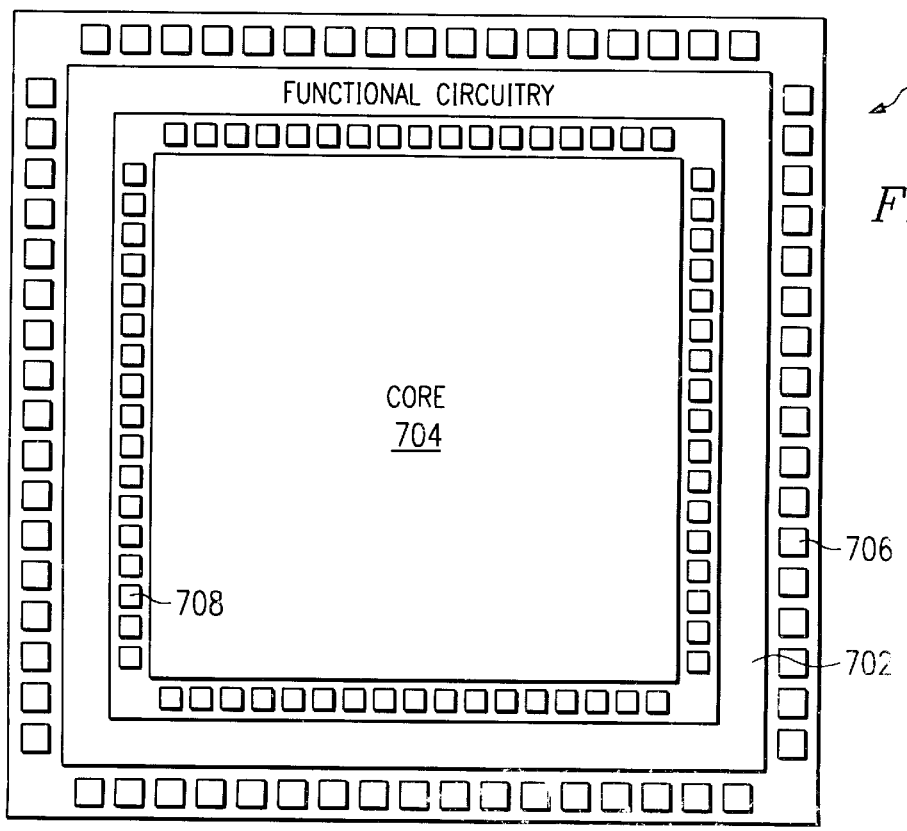
FIG. 7 depicts an integrated circuit that includes an embedded core.

In FIG. 7, an integrated circuit 700 contains within its functional circuitry 702 a complex core circuit 704, such a DSP. The integrated circuit's functional circuit 702 contains other circuits besides the core. Integrated circuit 700 includes peripheral bond pads 706 and core circuit 704 includes its own set of peripheral terminals 708. In this example, both the integrated circuit 700 and core 704 have been designed to include the previously described invention comprising scan distributor and scan collector circuits, parallel scan paths, and the controller 476.

Figure 8:
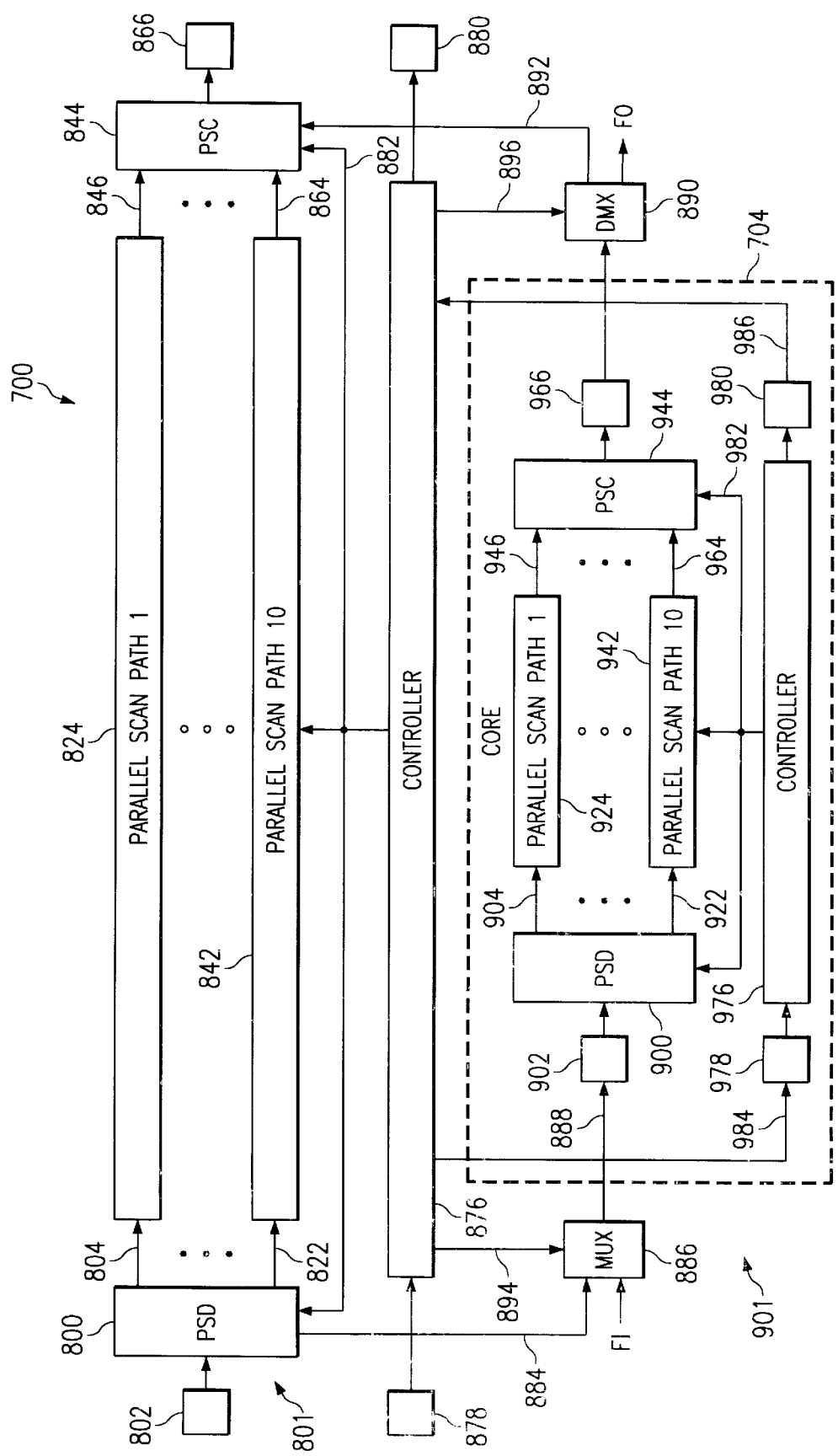
FIG. 8 is a block diagram of a scan test circuit and controller arrangement for testing the integrated circuit and core of FIG. 7 according to the present invention.

In FIG. 8, the integrated circuit 700 includes functional circuit and core circuit scan distributor and scan collector architectures. The view is simplified in that it depicts only one exemplary pair of scan distributor and scan collector circuits for each of the functional and core circuits.

In FIG. 8, functional scan test circuits 801 associate with functional circuits 702. Parallel scan distributor circuit 800 forms a data input amplification circuit connected between bond pad 802 and data inputs 804 through 822 to ten plural scan paths 824 through 842, of which only the first and last are depicted for clarity of the drawing. Parallel scan collector circuit 844 forms an output amplification circuit connected between the data outputs 846 through 864 of plural scan paths 824 through 842 and bond pad 866. Bond pads 802 and 866 are part of peripheral bond pads 706 of the functional circuits 702.

A controller 876 connects to the scan distributor circuit 800, parallel scan paths 1–10 824 through 842 and scan collector 844, by leads 882. Controller 876 controls the test operation of the scan distributor circuit 800, parallel scan paths 1–10 824 through 842 and scan collector 844. The controller 876 connects to bond pads 878 and 880 for access and control by a source external to the integrated circuit 700, such as a wafer or integrated circuit tester. Bond pads 878 and 880 are part of peripheral bond pads 706.

In core circuits 704, core scan test circuits 901 associate with core circuits 704. Parallel scan distributor circuit 900 forms a data input amplification circuit connected between terminal 902 and data inputs 904 through 922 to ten plural scan paths 924 through 942, of which only the first and last are depicted for clarity of the drawing. Parallel scan collector circuit 944 forms an output amplification circuit connected between the data outputs 946 through 964 of plural scan paths 924 through 942 and terminal 966. Terminals 902 and 966 are part of core circuit terminals 708 of the core circuits 704.

A controller 976 connects to the scan distributor circuit 900, parallel scan paths 1–10 924 through 942 and scan collector 944, by leads 982. Controller 976 controls the test operation of the scan distributor circuit 900, parallel scan paths 1–10 924 through 942 and scan collector 944. The controller 976 connects to terminals 978 and 980 for access and control by controller 876 over leads 984 and 986. Terminals 978 and 980 are part of core circuit terminals 708.

Scan distributor 800 has a serial output on lead 884 connecting to one input of multiplexer 886. The other input of multiplexer 886 receives a signal FI. The sole output of multiplexer 886 connects on lead 888 to terminal 902. Terminal 966 connects to the sole input of demultiplexer 890. One output of demultiplexer 890 on led 892 connects to a serial input of scan collector 844. The other output of demultiplexer 890 connects to a signal FO. Controller 876 connects to the multiplexer 886 on lead 894 and connects to the demultiplexer 890 on lead 896.

In the integrated circuit 700, the scan distributor 800 and scan collector 844 circuits are associated with the I/O bond pads for the integrated circuit 700. In the core 704, the scan distributor 900 and scan collector 944 circuits are associated with the I/O terminals for the core circuits 704. The scan distributor 800 and scan collector 844 circuits are the same as described in regard to FIG. 4, except that the scan distributor circuit 800 has been provided with a serial output 884 and the scan collector 844 circuit has been provide with a serial input 892. The core's scan distributor 900 and scan collector 944 circuits are the same as scan distributor 800 and scan collector 844 circuits with two exceptions: they are associated with the core's terminals 902 and 966 and they have no serial output 884 or serial input 892.

A multiplexer 886, or other type of connection circuit, is provided at each core terminal that has a scan distributor, and a demultiplexer 890, or other type of connection circuit, is provided at each core terminal that has a scan collector. The multiplexer allows inputting either a functional input signal or test input to the core terminal. The demultiplexer allows outputting either a functional output signal or test output from the core terminal.

The test input to the multiplexer 886 comes from the serial output of the integrated circuit's scan distributor circuit 800, and the test output from the demultiplexer 890 goes to the serial input of the integrated circuit's scan collector circuit 844. The functional input and output, FI and FO, are connected to neighboring circuits within the integrated circuit. During normal mode, the integrated circuit's controller 876 controls the multiplexers and demultiplexers at the core terminals to input and output the functional signals. In test mode, the controller 876 controls the multiplexers and demultiplexers to input and output test signals.

Controller 976 is not directly connected to the peripheral bond pads 878 and 880 as is controller 876. Rather, controller 976 for the core circuits is connected indirectly to the peripheral bond pads via the controller 876. Controller 876 has authority over the core's controller 976 in that controller 876 can enable, disable or modify the operation modes of controller 976. However, during test the controllers may operate together to synchronize the operation of the scan distributor and scan collector circuits of the integrated circuit and core.

As will be seen in embodiments to be described, this controller interconnect technique is maintained between controllers that are arranged hierarchically within an integrated circuit. Also, the authority of a higher level controller over a lower level controller is maintained in controllers arranged within a hierarchy. Further maintained is the ability of hierarchical controllers to synchronize themselves during test so that the operation of all hierarchically linked scan distributor and scan collector circuits, associated with the controllers, occur synchronously.

Testing, using the integrated circuit and core scan distributor and scan collector circuits of FIG. 8, is the same as previously described for the circuits of FIG. 4 with two exceptions. The serial data input to the core's scan distributor circuit 900 passes through the integrated circuit's scan distributor circuit 800 and the serial data output from the core's scan collector circuit 944 passes through the integrated circuit's scan collector circuit 844. Three types of testing can occur on the integrated circuit 700: (1) testing of the integrated circuit's functional non-core circuitry, (2) testing of the core circuitry, and (3) simultaneous testing of both the integrated circuit's non-core circuitry and the core circuitry.

When the integrated circuit's non-core circuitry is being tested, but the core is not being tested, the core's controller 976 is disabled by the integrated circuit's controller 876 and the multiplexer 886 and demultiplexer 890 disconnect the core's terminals from inputting or outputting functional signals to neighboring integrated circuit circuitry. In this mode the core is quiet and its I/O is disabled from disturbing testing being performed on the non-core circuitry.

When the core is being tested, but the non-core circuitry is not being tested, the core's controller 976 is enabled by the integrated circuit's controller 876. The integrated circuit's controller 876 controls the core terminal multiplexer 886 and demultiplexer 890 such that the serial data output from the integrated circuit's scan distributor circuit 800 is input to the core's scan distributor circuit 900, and the serial data output from the core's scan collector circuit 944 is input to the integrated circuit's scan collector circuit 944. Further, the integrated circuit controller 876 disables the non-core scan paths from shifting and capturing data and causes the scan distributor 800 and scan collector circuits 844 to operate as test data pipeline registers between the integrated circuit pads 802 and 866 and the core's scan distributor 900 and scan collector 944. During test, the core's scan distributor 900 and scan collector 944 circuits are controlled by the core's controller 976 to operate as described in regard to FIGS. 5 or 6. The only difference is that the depth of the scan data input to and output from the core's scan distributor 900 and scan collector 944 circuits is greater since the data is pipelined though the integrated circuit's scan distributor 800 and scan collector 844 circuits.

When both the integrated circuit's non-core and core circuitry are being tested, both the integrated circuit and core controllers 876 and 976 are enabled. Also the core terminal multiplexer 886 and demultiplexer 890 are set to input test data to the core's scan distributor 900 from the integrated circuit's scan distributor 800, and to output test data from the core's scan collector 944 to the integrated circuit's scan collector 844. During test, both controllers 876 and 976 are synchronized to the external control input from the tester via the peripheral bond pads to allow stimulus data to be scanned into both the integrated circuit and core scan distributor circuits while response data is scanned out from both the integrated circuit and core scan collector circuits.

The test operation of the integrated circuit and core scan distributor and scan collector circuits is identical to that previously described in regard to FIGS. 5 or 6. Again, the only difference is that the depth of the scan data input and scan data output is greater since the integrated circuit and core scan distributor and scan collector circuits are serially connected. The advantage of testing both the integrated circuit's non-core and core circuitry at the same time as that it reduces the test time of the integrated circuit.

These three modes of testing can be setup by scanning the integrated circuit and core controllers. Referring to FIG. 8, the integrated circuit controller is connected to integrated circuit pads for input and output and the core controller is connected to the integrated circuit controller for input and output. A tester that is connected to the integrated circuit controller input/output bond pads 706 can scan the controllers to set up the type of test to be performed. After setting up the test type, the tester can input control on input pads to cause the controllers to operate according to the way the controllers have been set up. While the integrated circuit 700 has one core, other integrated circuits may contain multiple cores. Multiple cores can be tested either individually or in combination with other cores and non-core circuits.

Figure 9:
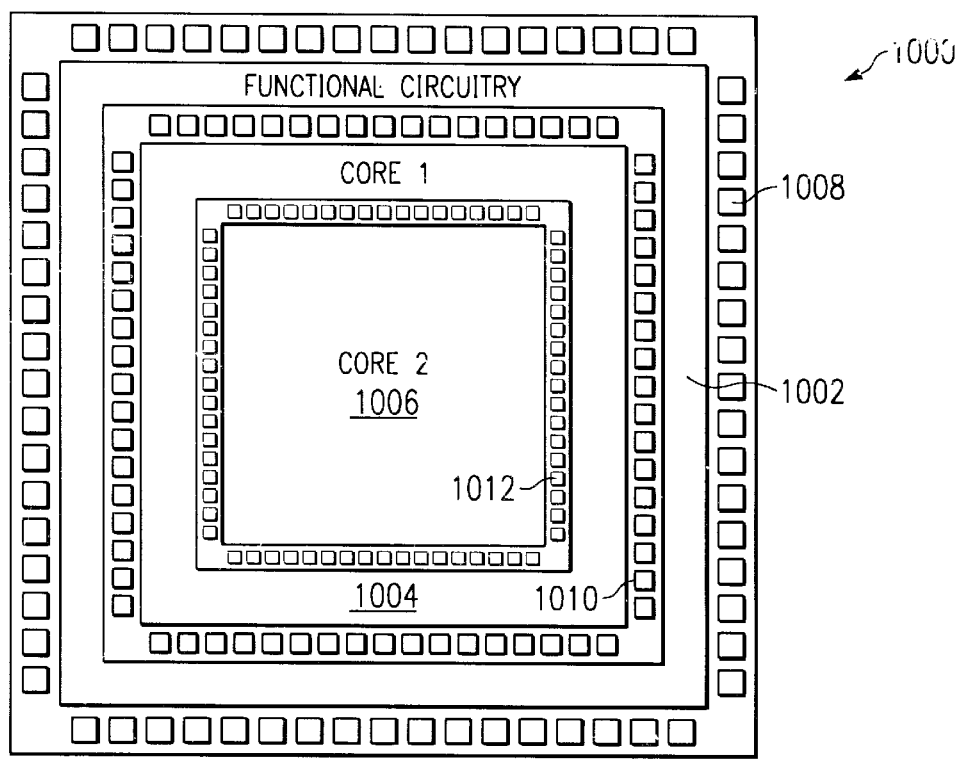
FIG. 9 depicts an integrated circuit including an embedded core, in which the embedded core itself includes an embedded core.

In FIG. 9, integrated circuit 1000 contains functional circuitry 1002, which contains first core circuitry 1004. First core circuitry 1004 contains second core circuitry 1006. This hierarchical embedding of core circuitry or cores within cores creates a very difficult testing situation. The present invention however renders such nesting of cores testable regardless of how deeply embedded they might be within an integrated circuit.

Functional circuitry 1002 is associated with bond pads 1008. First core circuitry is associated with terminals 1010. Second core circuitry is associated with terminals 1012.

Figure 10:
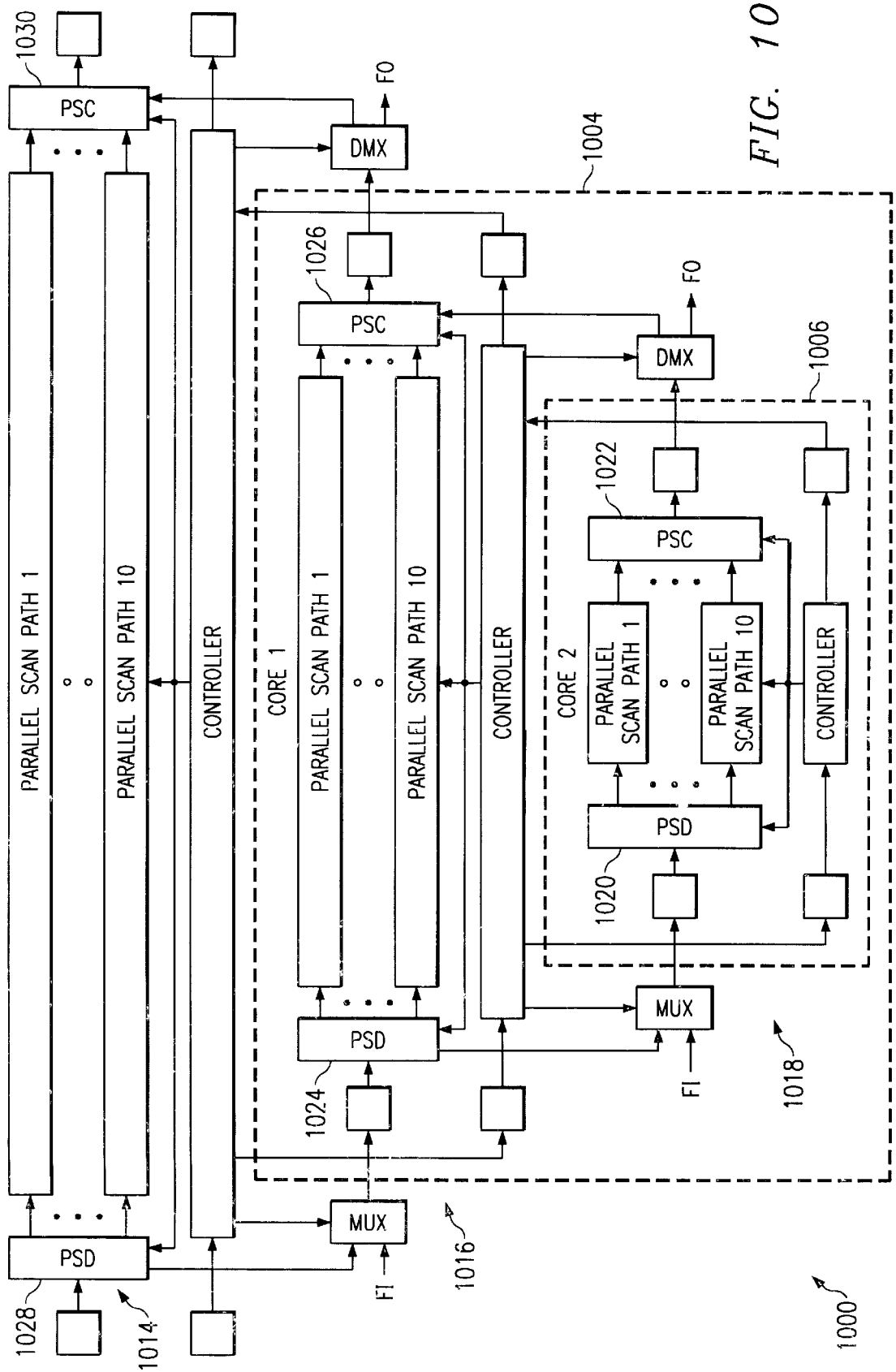
FIG. 10 is a block diagram of a scan test circuit and controller arrangement for testing the integrated circuit and embedded cores of FIG. 9 according to the present invention.

In FIG. 10, the scan distributor and scan collector architecture is shown hierarchically extending from the integrated circuit level to the first core level, and from the first core level into the second core level. Integrated circuit 1000 comprises functional scan test circuits 1014 associated with functional circuitry 1002, first scan test circuits 1016 associated with first core circuits 1004 and second scan test circuits 1018 associated with second core circuits 1006.

In accordance with the circuits depicted in FIGS. 7 and 8, test access to the second scan test circuits 1018 is achieved through the serial pipelines provided by the first scan test circuits 1016 and functional scan test circuits 1014. Thus the scan distributor 1020 and scan collector 1022 circuits of second core circuits 1006 is achieved via the serial pipelines provided by the scan distributor and scan collector circuits 1024 and 1026 of first scan test circuits 1016 and the scan distributor and scan collector circuits 1028 and 1030 of the functional scan test circuits 1014.

Also as described in regard to FIG. 8, all the functional circuits 1002, first core circuits 1004 and second core circuits 1006 can be tested together, in selected combinations, or individually. When testing all of the integrated circuit's circuitry together, the scan distributor and scan collector circuits and controllers are set up to allow the tester to input deep stimulus patterns to serially connected scan distributors and to output deep response patterns from serially connected scan collectors. The test is the same as described in connection with FIG. 8, only the depth of the serial stimulus and response patterns changes as more scan distributor and scan collector circuits are added to the integrated circuit's bond pad input and output scan operations.

Figure 11:
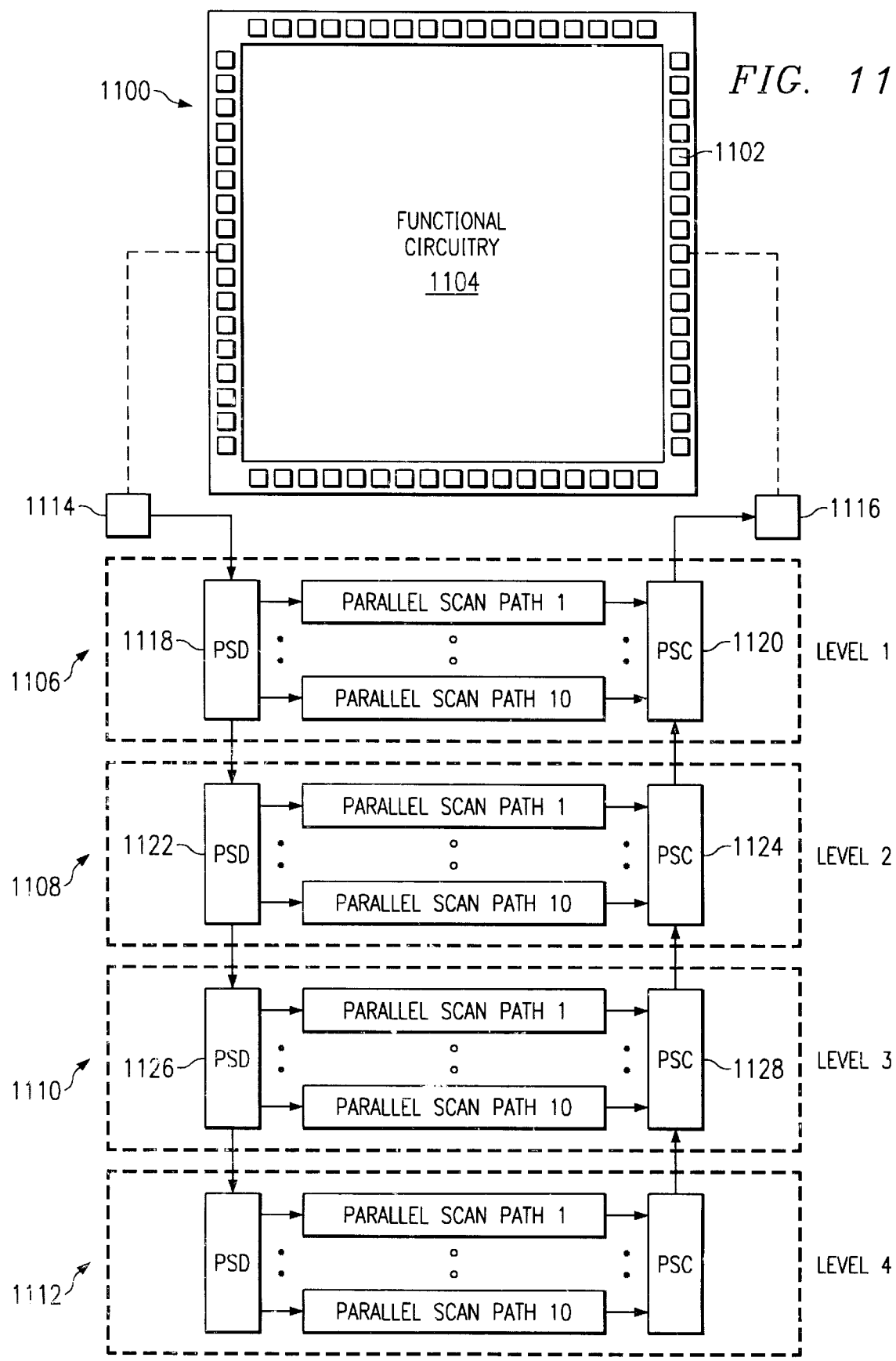
FIG. 11 is a block diagram of a hierarchical connection between scan test circuit arrangements according to the present invention.

In FIG. 11, integrated circuit 1100 includes peripheral bond pads 1102, functional circuits 1104 and scan test circuits 1106, 1108, 1110 and 1112. Scan test circuits 1106, 1108, 1110 and 1112 are connected in series to each of bond pads 1114 and 1116.

The scan test circuits 1106, 1108, 1110 and 1112 illustrate a simplified view of how scan distributor and scan collector circuits can be used hierarchically within an integrated circuit to bring about massive parallel scan testing. Each available pair of integrated circuit bond pads can be viewed as entry and exit points to a hierarchical arrangement of embedded scan distributor and scan collector circuits. Each scan distributor and scan collector circuit can be serially linked to the bond pads, either directly, as with the scan distributor and scan collector circuits 1118 and 1120, or via intermediate scan distributor and scan collector circuits, such as scan distributor and scan collector circuits 1122 and 1124, or 1126 and 1128.

In FIG. 11, 4 levels of 10 bit scan distributor and scan collector circuits are linked to the bond pad pair 1114, 1116 to provide a 40 bit wide test data input and output interface using only two of the integrated circuit bond pads. Each level could represent the hierarchical position of an embedded core within the integrated circuit. While not shown, all available pad pairs (i.e. pads not used for test control or power/ground) can be similarly connected in a hierarchical arrangement to 40 bit wide scan distributor and scan collector circuits inside the integrated circuit. A tester connected to the pad pairs can transfer test data to the target test circuits residing in the integrated circuit at each hierarchical circuit level 1–4. The serial to parallel and parallel to serial test data operation of hierarchically arranged scan distributors and scan collectors is clear from FIG. 11.

Figure 12:
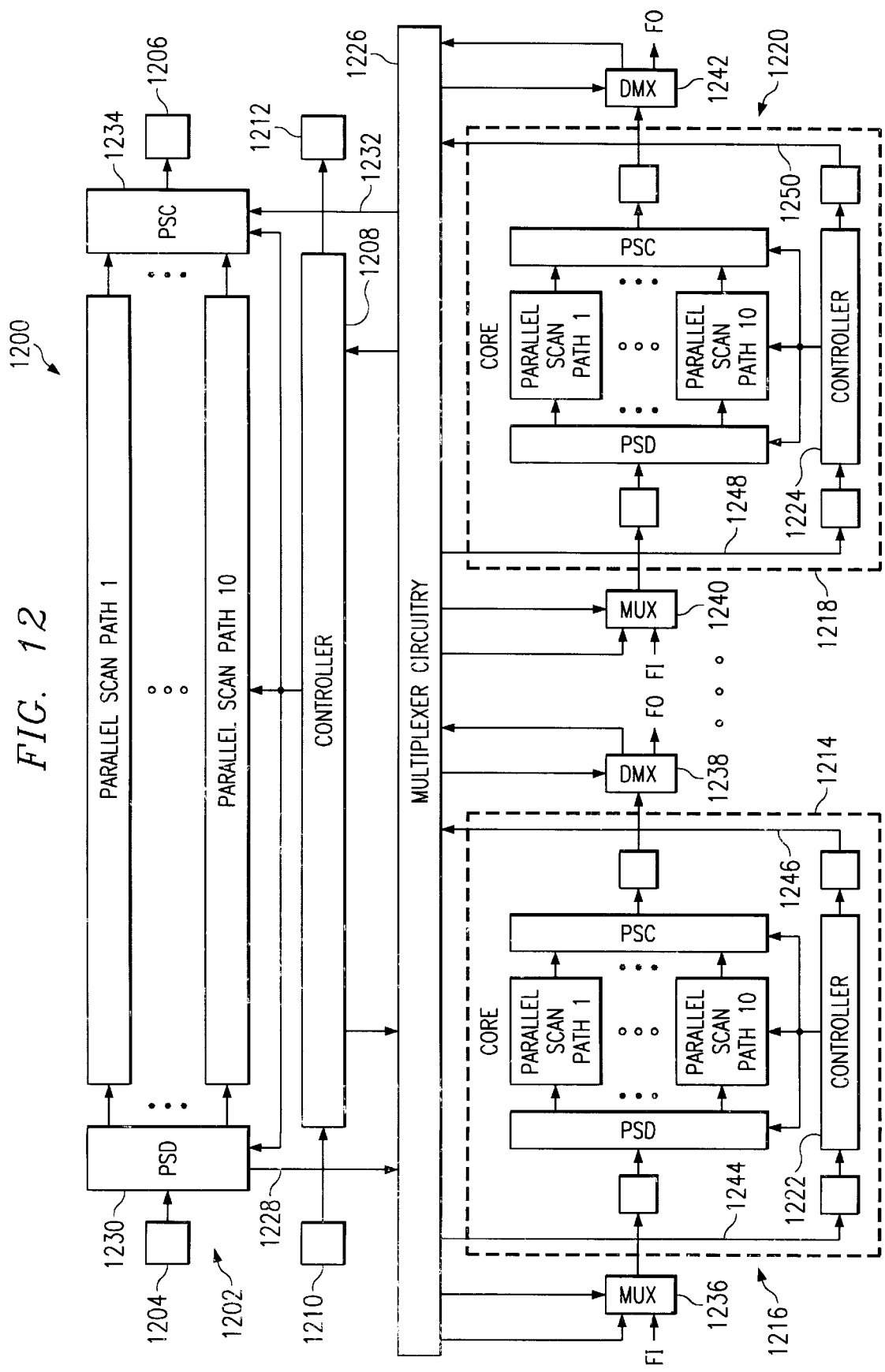
FIG. 12 is a block diagram of an arrangement of scan test circuits and controllers using multiplexer circuitry according to the present invention.

In FIG. 12, integrated circuit 1200 includes scan test circuits 1202 connected to bond pads 1204 and 1206. Controller 1208 connects to bond pads 1210 and 1212 and scan test circuits 1202. Integrated circuit 1200 also includes core circuits 1214 that include scan test circuits 1216 and core circuits 1218 that include scan test circuits 1220. Controller 1222 is associated with scan test circuits 1216 and controller 1224 is associated with scan test circuits 1220.

Multiplexer circuitry 1226 connects scan test circuits 1202 to scan test circuits 1216 and 1220. A serial output 1228 of scan distributor 1230 connects to the multiplexer 1226 and a serial input 1232 of scan collector 1234 connects to multiplexer 1226. Scan test circuits 1216 connect to multiplexer 1226 through multiplexer 1236, which also receives a functional input FI, and through demultiplexer 1238, which also provides a functional output FO. Scan test circuits 1220 connect to multiplexer 1226 through multiplexer 1240, which also receives a functional input FI, and through demultiplexer 1242, which also provides a functional output FO. Controllers 1222 and 1224 also connect to multiplexer 1226 through respective leads 1244, 1246, 1248 and 1250.

Integrated circuit 1200 provides an alternate configuration for using scan distributor and scan collector circuits whereby costs 1214 and 1218 are individually selected and connected to the integrated circuit's scan distributor and scan collector circuitry and controller for testing. This selection is achieved by placing multiplexer circuitry 1226 between the integrated circuit's scan distributor 1230, scan collector 1234, and controller 1208 circuitry, and the cores. Thus the cores 1214 and 1218 can be individually connected to the serial data input and output of the integrated circuit's scan distributor and scan collector circuitry and to the integrated circuit's controller. The integrated circuit's controller supplies the control input to the multiplexer circuitry for selecting a core for testing. Once a core is selected and connected to the integrated circuit's scan distributor and scan collector circuitry, the core is tested as previously described.

It is important to note that when the integrated circuits 446, 700, 1000, 1100 or 1200 evolve into a core for use inside another integrated circuit, their hierarchical scan distributor and scan collector test architectures are reusable inside that integrated circuit. The ability to reuse the test architecture, as well as the test patterns developed for the architecture, is an important feature of the present invention. This feature prevents having to spend design resources and time redesigning the core's test architecture each time the core is used inside a new integrated circuit. A core's scan distributor and scan collector test architecture can be viewed as plug and play as far as its reuse within an integrated circuit.

Figure 13:
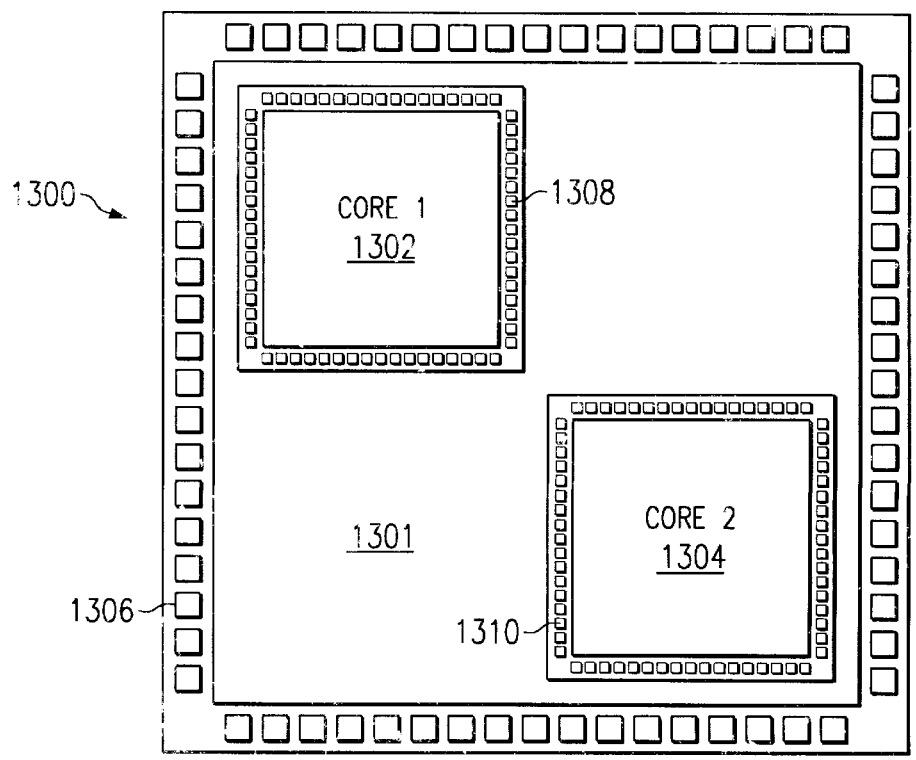
FIG. 13 depicts an integrated circuit.

In FIG. 13, integrated circuit 1300 contains non-core circuitry 1301, core 1 1302 and core 2 1304 that contain the disclosed scan distributor and scan collector test architecture. Integrated circuit 1300 has bond pads 1306, core 1 1302 has terminals 1308 and core 2 1304 has terminals 1310. If each of the cores have a number of terminals that consume most of the pads on the integrated circuit, they will have to be individually selected and tested using the multiplexing approach described in regard to FIG. 12. However, if the cores have a small number of terminals relative to the number of integrated circuit pads then parallel or simultaneous testing of the cores is possible as described in FIG. 14 below.

Figure 14:
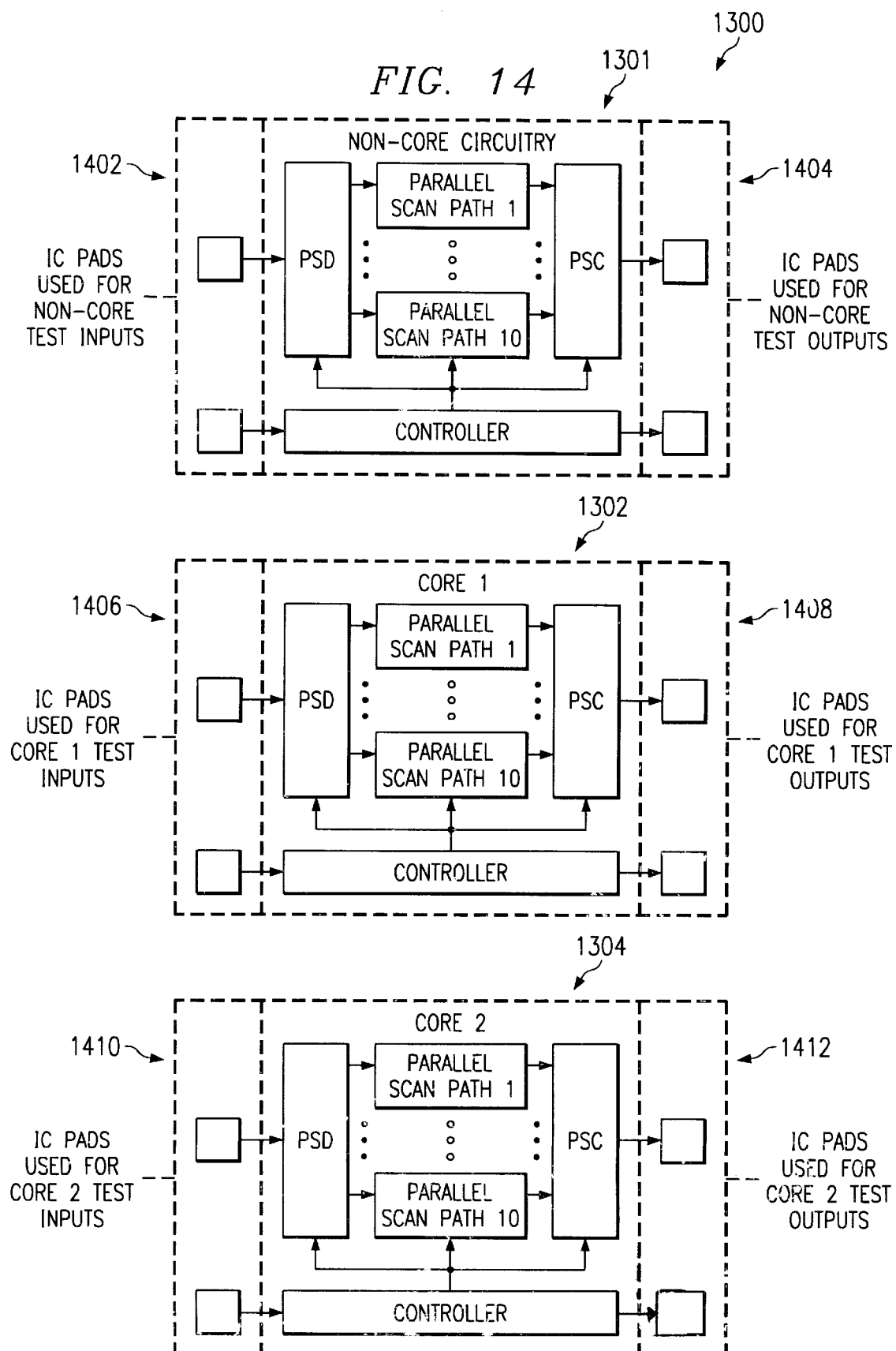
FIG. 14 is a block diagram of an arrangement of scan test circuits and controllers for the integrated circuit of FIG. 13.

In FIG. 14, non-core circuitry 1301, core 1 1302, and core 2 1304 of the integrated circuit 1300 of FIG. 13 each contain integrated circuit pad connections to their scan distributor and scan collector architectures for parallel testing. This is possible because the number of terminals required to gain access to the scan distributor and scan collector architectures associated with the non-core circuitry, core 1, and core 2 is less than or equal to the number of available integrated circuit pads. The test terminals 1402, 1404 for the scan distributor and scan collector architecture for the non-core circuits, as well as the test terminals 1406, 1408 and 1410, 1412 for the scan distributor and scan collector architecture of core 1 and core 2 can all be coupled to integrated circuit pads of integrated circuit 1300.

For simplification only one pair of scan distributor and scan collector circuits are shown in the non-core, core 1 and core 2 examples of FIG. 14. However, each example may contain a plurality of scan distributor and scan collector circuit pairs coupling a plurality of grouped scan paths. Also in FIG. 14 it is seen that each controller within each scan distributor and scan collector architecture is shown connected to separate integrated circuit pads. Having separate pads coupled to each architecture's scan distributor, scan collector, and controller allows each architecture to be operated independently. For example, testing of the non-core circuitry, core 1, and core 2 could occur in response to a different control and data communication at the integrated circuit pads coupled to the respective architectures. Thus testing could occur at different times, have different durations, and/or use different clock rates. The cores 1 and 2 of FIG. 14 may contain embedded cores as shown in FIGS. 9 and 10, each embedded core containing scan distributor and scan distributor architectures and being testable as previously described.

Controller Description

Figure 15A:
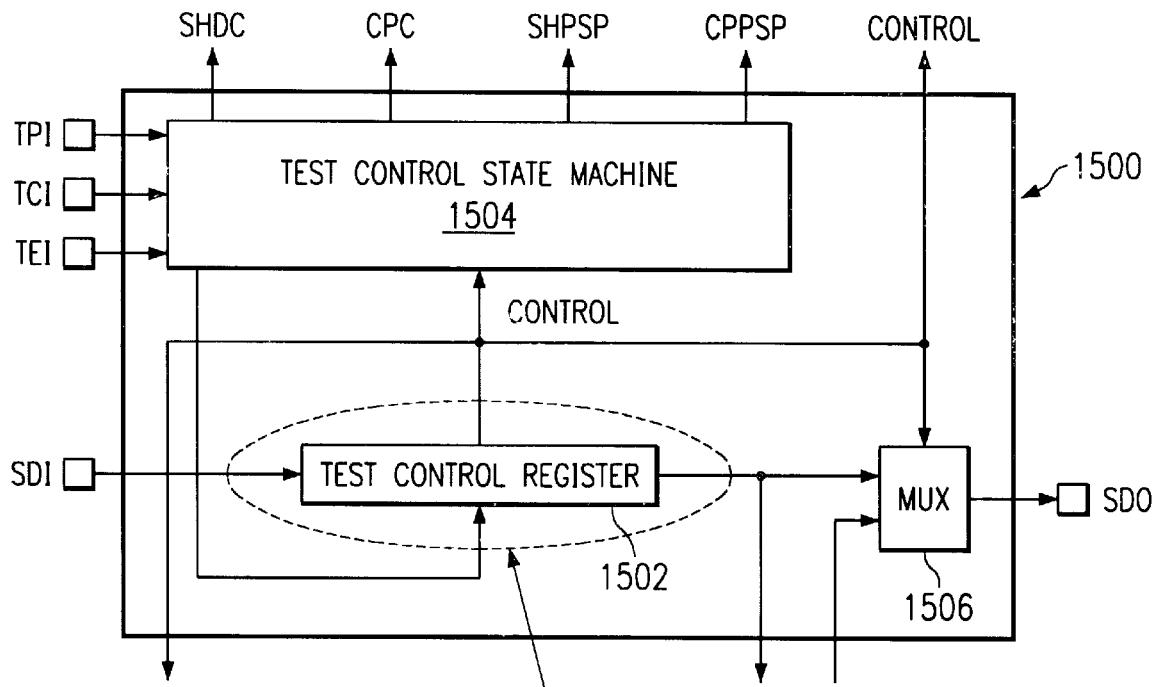
FIGS. 15A and 15B are block diagrams of a controller used in the scan test circuits.

In FIG. 15A a controller 1500 is an example of the controller used in the disclosed scan distributor and scan collector architecture. The controller 1500 consists of a test control register 1502, a test control state machine 1504, and a multiplexer 1506. The state machine 1504 has inputs for receiving a test protocol input (TPI), a test clock input (TCI), a test enable input (TEI), and control input from the test control register. The TPI, TCI, and TEI signals are input to the controller either by integrated circuit pads, or core terminals, as seen in FIG. 8.

The state machine 1504 has outputs for providing a shift distributor and collector output (SHDC), a capture collector output (CPC), a shift parallel scan path output (SHPSP), and a capture parallel scan path output (CPPSP). The SHDC, CPC, SHPSP, and CPPSP signals are output from the controller to the scan distributor, scan collector, and scan path circuits, as shown in FIG. 8, and are used to control the scan distributor, scan collector, and scan path circuits during test. Additional signals may be output from the state machine as required to provide different types of control during test. The state machine also has control outputs which are input to the test control register.

The test control register 1502 has an input for receiving a serial data input (SDI) and inputs for receiving control from the state machine. The SDI signal is input to the controller either by an integrated circuit pad or core terminal, as seen in FIG. 8. The test control register has an output for providing a serial data output 1 (SDO1, an output for providing a test enable output (TEO) to a connected lower level controller, and a controller bus output that provides control to the state machine and multiplexer within the controller, and to the scan distributor, scan collector, and scan path circuits of the test architecture, including test multiplexers and demultiplexers shown in FIGS. 8 and 12, external of the controller. The multiplexer inputs control and SDO1 from the test control register, and a serial data input 1 (SDI1). The multiplexer outputs a serial data output (SDO). The SDO signal is output from the controller either by an integrated circuit pad or core terminal, as seen in FIG. 8.

The state machine responds to the TPI, TCI and TEI inputs to: (1) control the operation of the test control register via the control output from the state machine, and (2) control the operation of the external scan distributor, scan collector, and scan path circuits via the SHDC, CPC, SHPSP, and CPPSP outputs from the state machine. The control input to the state machine from the test control register is used to program the way the scan distributor, scan collector, and scan path circuits are controlled using the SHDC, CPC, SHPSP, and CPPSP signals. Also, the programming control input to the state machine can also modify the operation of the SHDC, CPC, SHPSP, and CPPSP signals, and enable additional control output signals to allow other types of test control sequences to be performed.

State Machine Control of Test Control Register

Figure 15B:
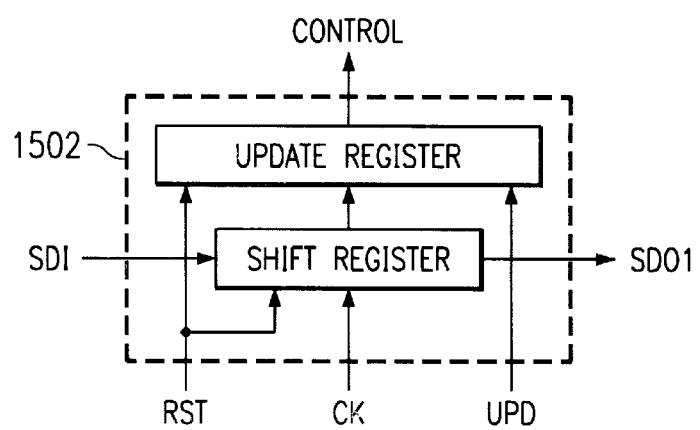

In FIG. 15B, the test control register 1502 contains a shift register 1510 and an update register 1512. The shift and update registers are initialized by a reset (RST) control output from the state machine. The shift register shifts data from SDI to SDO1 by a clock (CK) control output from the state machine. The update register updates control data from the shift register by an update (UPD) control output from the state machine. The update register is used to prevent the control outputs of the test control register from changing as data is shifted through the shift register, and its use as such is well in the art.

When TEI is low, the state machine is disabled to a known state and outputs a low on RST to initialize the shift and update registers of the test control register. When initialized, the test control register outputs control to the multiplexer to connect SDO1 to SDO. Also, following initialization, the test control register outputs control to the state machine to: (1) establish an initial operation mode for the state machine's SHDC, CPC, SHPSP, and CPPSP outputs, (2) output control to the scan distributor, scan collector, and scan path circuits external of the controller to enable normal operation of the integrated circuit or core in which the controller resides, and (3) outputs a low on TEO to similarly disable and initialize any connected lower level controller.

When TEI is high, the state machine is enabled to respond to the TCI and TPI inputs to scan data through the test control register from SDI to SDO, and to update and output control data from the test control register. It is important to note that when the state machine is first enabled to scan data through the test control register, the scan path only includes the test control register between the SDI path input and SDO output. The control data updated from the test control register following a scan operation may include control to condition the multiplexer and the TEO output to allow a scan path connected between the SDO1 and SDI1 signals to be added to the test control register scan path so that it may be included in subsequent test control register scan operations. A scan path existing between SDO1 and SDI1 that has been added to the test control register scan path, may be deleted from being scanned by conditioning the multiplexer and TEO output to disallow scan operations through the scan path between SDO1 and SDI1. U.S. Pat. No. 4,872,169 by Whetsel, entitled Hierarchical Scan Selection, describes a method of adjusting scan path lengths.

State Machine Control of Scan Distributors, Scan Collector, and Scan Path Circuits In addition to responding to TPI and TCI input to operate test control register scan operations, the state machine responds to TPI and TCI input to operate the SHDC, CPC, SHPSP, and CPPSP outputs to the scan distributor, scan collector, and scan path circuits. Prior to operating the SHDC, CPC, SHPSP, and CPPSP outputs, a scan operation to the test control register is performed. This scan operation establishes control input to the state machine to program the SHDC, CPC, SHPSP, and CPPSP outputs to operate in modes to support the types of testing previously described in regard to the non-hierarchical scan distributor and scan collector architecture of FIG. 4 and the hierarchical scan distributor and scan collector architecture of FIG. 8. This scan operation also establishes the type of test mode control which is output from the controller and input to the scan distributor, scan collector, scan path, and other associated test circuits, such as the multiplexer and demultiplexer circuits of FIGS. 8 and 12.

If a non-hierarchical test operation is to be performed, i.e. only a single controller and its associated scan distributor and scan collector circuits are being setup for testing (FIG. 4), a single test control register scan operation is all that is required prior to using the state machine to operate the SHDC, CPC, SHPSP, and CPPSP outputs. However, if a hierarchical test operation is to be performed, i.e. multiple levels of controllers and their associated scan distributor and scan collector circuits are being setup for testing (FIG. 8), multiple test control register scan operations are required, prior to using the state machine to operate the SHDC, CDPC, SHPSP, and CPPSP outputs, to allow the scan paths of the lower level controllers to be connected to the scan path of the highest level controller, as will be described later in regard to FIGS. 17, 18, and 19.

In a non-hierarchical test operation, for example as described in FIG. 4, the state machine receives control from TPI and TCI to scan the test control register to setup the test to be performed. Following this scan operation, the state machine receives further control from TPI and TCI to operate the SHDC, CPC, SHPSP, and CPPSP outputs to control the scan distributor, scan collector, and scan path circuits during the test. To understand better the operation of the state machine, a state diagram is provided in FIG. 16. This state diagram accompanied by the following description provides a description of how the state machine operates.

Figure 16:
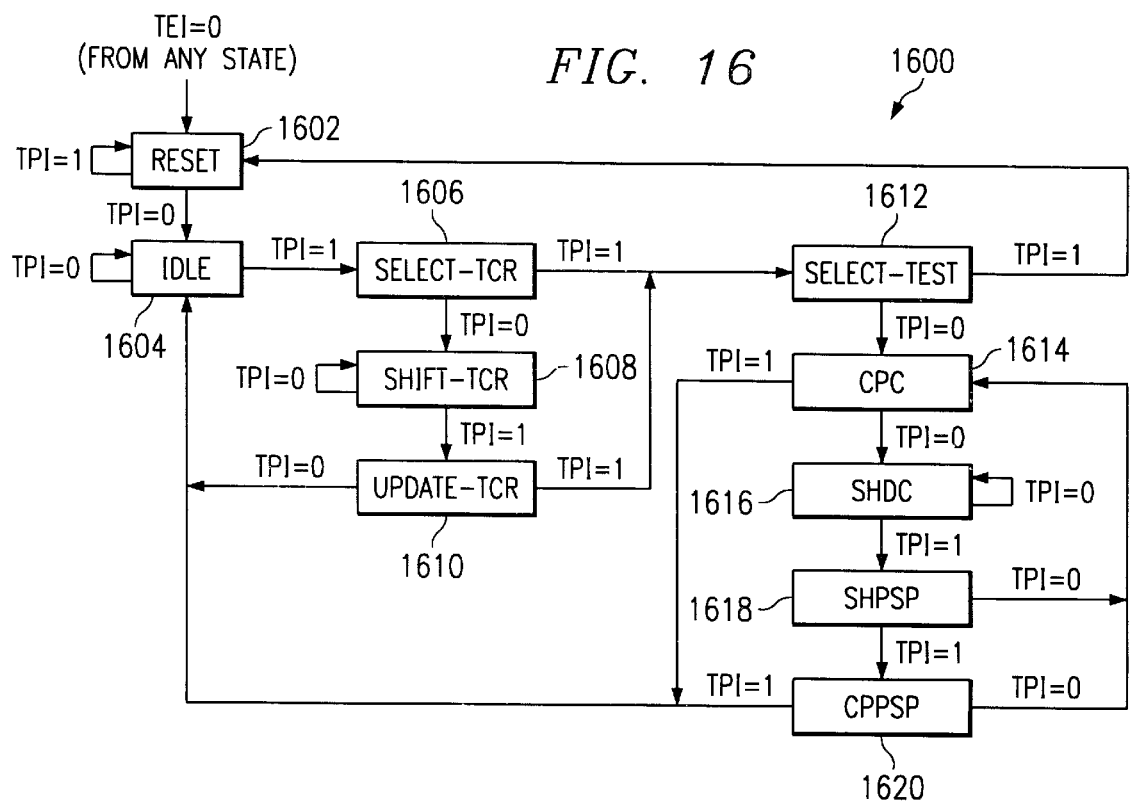
FIG. 16 is a flow chart of states used in the controller of FIGS. 15.

In FIG. 16, an example state diagram 1600 of one preferred implementation of the state machine is shown. This diagram illustrates how the state machine responds to the TPI and TCI inputs to transition into various states that enable scanning of the test control register and controlling of the scan distributor, scan collector, and scan path circuits. The TCI input to the state machine is the clock that times the operation of the state machine, whereas the TPI input to the state machine is the input that causes the state machine to transition between its states.

Whenever the TEI input is low, the state machine goes to and remains in the reset (RESET) state 1602 and will not respond to the TPI input. In the RESET state, the state machine outputs control to initialize the test control register as previously described. When the TEI input is high, the state machine is enabled to respond to the TPI input. After TEI goes high, the state machine remains in the RESET state if TPI is high. The state machine transitions to and remains in the idle (IDLE) state 1604 in response to a low on TPI. In the IDLE state, the RST control input to the test control register (FIG. 15B) is set high to remove the rest condition on the shift and update registers.

In response to a high and low input on TPI, the state machine transitions to the shift test control register state (SHIFT-TCR) 1606, via the select test control register state (SELECT-TCR) 1608. In the SHIFT-TCR state, the state machine output control (CK of FIG. 15B) to shift data through the test control register from SDI to SDO of FIG. 15A. The state machine remains in the SHIFT-TCR state for the number of TCI inputs required to shift data into the test control register. When the shift operation is complete, a high on TPI transitions the state machine into the update test control register state (UPDATE-TCR) 1610, where the state machine outputs control (UPD of FIG. 15B) to cause the update register to load and output the data shifted into the shift register.

From the UPDATE-TCR state 1610, the state machine is designed to either transition back to the IDLE state 1604 if TPI if low, or transition to the select test state (SELECT-TEST) 1612 if TPI is high. This two way next state decision was designed into the state machine to facilitate the invention's ability to setup either hierarchical or non-hierarchical test architectures. For example, if the test setup is for a non-hierarchical test architecture (i.e. FIG. 4), the next state from UPDATE-TCR is preferably the SELECT-TEST state 1612 to allow the state machine to immediately start outputting SHDC, CPC, SHPSP, and CPPSP control to the scan distributor, scan collector, and scan path circuits. However, if the test architecture is hierarchical (i.e. FIG. 8), the next state from UPDATE-TCR will preferably be the IDLE state 1604 to allow transitioning back into the SHIFT-TCR state to scan additional setup control data into a lower level controller that has been enabled, via TEO, and whose test control register has been inserted into the test control register scan path of the higher level controller, via SDO1 and SDI1.

When all setup scan operations are completed, the state machine responds to TPI to transition into the SELECT-TEST state 1612. In the SELECT-TEST state a decision can be made that will start the test by enabling the SHDC, CPC, SHPSP, and CPPSP outputs, or not start the test and return to the RESET state. Assuming it is desired to start the test, the state machine will respond to TPI to transition from SELECT-TEST to the CPC state 1614. In the CPC state, the state machine outputs CPC control to enable the scan collectors to capture the serial data output from the scan paths. After the data is captured, the state machine responds to TPI to transition into the SHDC state 1616 where the state machine outputs SHDC control to enable data to be shifted into the scan distributors and shifted out of the scan collectors.

After remaining in the SHDC state long enough to fill the scan distributors and empty the scan collectors, the state machine responds to TPI to transition into the SHPSP state 1618. In the SHPSP state, the state machine outputs SHPSP control to enable the scan paths to shift in data from the scan distributors. If the scan paths have not been filled with data from scan distributors, the state machine will be controlled by TPI to transition from the SHPSP state to the CPC state 1614. If the scan paths have been filled with data from the scan distributors, the state machine will be controlled by TPI to transition from the SHPSP state into the CPPSP state 1620. In the CPPSP state, the state machine outputs CPPSP control to enable the scan paths to capture data from combinational logic being tested. If the test is not complete, the state machine will respond to TPI to transition from the CPPSP state to the CPC state and repeat the above test control sequence. IF the test is complete, the state machine can respond to TPI to transition from the CPPSP state directly to the IDLE state 1064.

As seen in FIG. 16, the state machine 1504 may also complete a test by transitioning into the IDLE state from the CPC state 1614. At the end of a test, the state machine responds to TPI to transition from the IDLE state to the RESET state. Alternately, the state machine may enter the RESET state from any state in response to a low on TEI.

The state machine state diagram of FIG. 16 closely mirrors the more general descriptive state diagram previously shown and described in regard to FIG. 6. For example, state 501 of FIG. 6 relates to the starting of the test, which in FIG. 16 relates to the TEI signal going high. State 502 of FIG. 6 relates to the configuring of a test, which in FIG. 16 relates to the setup scan operation performed by transition through the SHIFT-TCR and UPDATE-TCR states 1608 and 1610. State 503 of FIG. 6 relates to the capturing of data outputs from scan paths into scan collector, which in FIG. 16 relates to the CPC state 1614. State 504 of FIG. 6 relates to the filling and emptying of the scan distributors and scan collectors, which in FIG. 16 relates to the SHDC state 1616.

State 605 of FIG. 6 relates to the inputting of data from the scan distributors to the scan paths, which in FIG. 16 relates to the SHPSP state 1618. State 508 of FIG. 6 relates to the capturing of data by the scan paths, which in FIG. 16 relates to the CPPSP state 1620. State 509 of FIG. 6 relates to exiting the test mode and returning the circuit (integrated circuit or core) back to the normal mode of operation, which in FIG. 16 relates to transitioning into the RESET state 1602.

In FIG. 6, the inner loop, comprising state transitions 503, 504, 605, and back to 503, used to capture data into the scan collectors from the scan paths, shift data in and out of the scan distributors and scan collectors, and load data into the scan paths from the scan distributors, relates to the inner loop of FIG. 16 comprising state transitions CPC 1614, SHDC 1616, SHPSP 1618, and back to CPC 1614. Also, in FIG. 6, the outer loop, comprising state transitions 503, 504, 605, 508, and back to 503, used to additionally perform the step of capturing data from the combinational logic into the scan paths after the scan paths have been filled with data from the scan distributors as a result of performing the inner loop multiple times, relates to the outer loop of FIG. 16 comprising state transitions CPC 1614, SHDC 1616, SHPSP 1618, CPPSP 1620 and back to CPC 1614.

In the state machine of FIGS. 15A and 16, it is seen that TPI is a single signal used for regulating the operation of multiple test control signal outputs from the state machine. While multiple control signals could be directly used, instead of having them generated by a state machine in response to a single TPI signal, it would increase the number of test control signal paths required to be routed to the controller. The advantage of having a single signal for regulating the operation of multiple test control outputs from a state machine will be seen later in regard to FIGS. 17, 18, and 19 where examples of the connectivity between hierarchically arranged controllers are shown.

Also, in the above description of the way the state machine controls scan distributor, scan collector, and scan path circuits it is important to note that the control outputs do not necessarily need to control the operations directly, but rather the control outputs may be used to provide timing windows within which the state control operation occurs. For example, when the CPPSP control output is generated in the CPPSP state, the timing to perform the capturing of data into the scan path may come from the CPPSP signal directly or, alternately, the CPPSP signal may simply provide a timing window in which a different signal is allowed to perform the capture operation.

The different signal may for example be a functional clock signal that normally controls the registers of the scan path when they are in normal mode and not configured into test mode as previously described in regard to FIGS. 4 and 5. Similarly, the other control signals, CPC, SHDC, and SHPSP may either directly control their stated operations, or, alternatively, each may provide a timing windows in which other signals may be allowed to control the stated operations. Also, if other signals are allowed to perform an operation, the number of times the other signals are allowed to perform the operation will be controlled by the number of TCI clocks consumed by the state machine during that timing window. For example, the state machine only remains in the SHPSP state for a single TCI clock period. If the SHPSP control signal enables another signal to shift the scan paths during the SHPSP state, the number of shifts will be limited to one, regardless of whether the other signal has a frequency much higher than the frequency of the TCI signal.

Hierarchical Controller Arrangements and Operation

Figure 17:
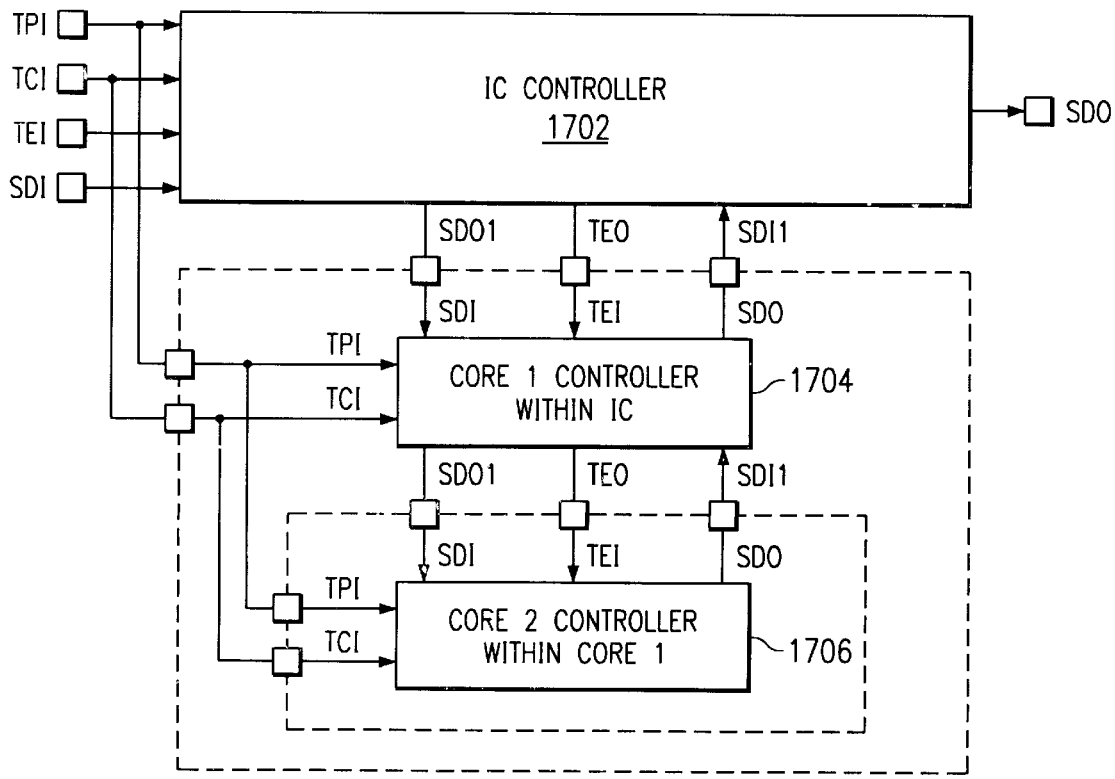
FIG. 17 is a block diagram of controllers arranged in a hierarchy.

In FIG. 17, multiple controllers 1702, 1704, and 1706 are be connected in a hierarchy. FIG. 17 relates to previous FIGS. 8 and 10 that depicted embedded cores, each having scan distributor and scan collector architectures, connected to form deep scan distributor and scan collector test channels accessible from the integrated circuits pads. As mentioned in regard to FIGS. 8 and 10, the integrated circuit's controller has authority over lower level controllers to allow the integrated circuit controller to establish test modes in lower lever controllers, via the test control register, and to synchronize the test operations of lower level controllers to the integrated circuit level controller. As previously mentioned, each of the embedded cores may have been an integrated circuit prior to being utilized as an embedded core. Each core therefore has the same controller inputs and outputs as would an integrated circuit controller, i.e. TPI, TCI, TEI, SDI, SDO, SDO1, TEO, and SDI1. Even if the embedded core were not previously integrated circuits, they would preferably be designed with these same controller inputs and outputs to allow hierarchically connecting the cores together as described below.

FIG. 15A has provided a detail view and description of the controller. FIG. 17 illustrates how the hierarchical interconnect structure between an integrated circuit controller 1702, a core 1 controller 1704 embedded within the integrated circuit, and a core 2 controller 1706 embedded within core 1 is accomplished. The integrated circuit controller 1702 is connected to the integrated circuit pads via the previously described TPI, TCI, TEI, SDI, and SDO signals. The integrated circuit controller's SDO1 output is connected to the SDI input of the core 1 controller 1704. The integrated circuit controller's SDI1 input is connected to the SDO output of the core 1 controller 1704. The integrated circuit controller's TEO output is connected to the TEI input of the core 1 controller 1704. Core 1 controller's SDO1 output is connected to the SDI input of the core 2 controller 1706. Core 1 controller's SDI1 input is connected to the SDO output of the core 2 controller 1706. Core 1 controller's TEO output is connected to the TEI input of the core 2 controller 1706. The TPI and TCI inputs to both core 1 and core 2 controllers are directly connected to the integrated circuit's TPI and TCI pads, as is the TPI and TCI inputs to the integrated circuit controller. This hierarchical interconnect structure would continue if additional embedded cores were present in core 2.

Based on the hierarchical interconnect structure description given above, the steps of hierarchically accessing the controllers within the interconnect structure will now be described. Initially, all controllers will be reset by the TEI pad input being low. From the controller description of FIG.

15A, if the TEI input is low, the TEO output will be low. Therefore, all controllers will be reset by a low on the TEI pad, due to the TEO and TEI connections between the controllers. If TEI is set high, a first scan operation of the integrated circuit controller's test control register can be performed. This first scan operation sets the TEI input to the core 1 controller 1704 high, and also selects core 1 to be inserted into the integrated circuit controller's scan path, via SDO1 and SDI1. A second scan operation is performed which scans data through both the integrated circuit and core 1 test control registers. This second scan operation sets the TEI input to the core 2 controller 1706 high, and also selects core 2 to be inserted into the core 1 controller's scan path, via SDO1 and SDI1. A third scan operation can now be performed to load control data into all test control registers of the integrated circuit, core 1, and core 2 controllers to begin a test.

In this description, multiple test control register scan operations have been used to enable multiple embedded controllers to be added to the scan path of the integrated circuit controller. This multiple scan operation is facilitated by the design of the state diagram of FIG. 16, which provides a loop between the IDLE, SELECT-TCR, SHIFT-TCR, UPDATE-TCR, and IDLE states 1604, 1606, 1608, 1610, and 1604. In this loop, the IDLE state serves as a synchronization state for adding test control registers of lower level controllers to the test control registers of higher level controllers. For example, when the TEO output from a higher level controller is input to the TEI input of a lower level controller during the UPDATE-TCR state, the lower level controller is enabled to follow the TPI input. Thus, as the enabling higher level controller transitions to IDLE from UPDATE-TCR in response to a low on TPI, the enabled lower level controller transitions to IDLE from RESET, also in response to the low on TPI. As a result, synchronization occurs between the enabling and enabled controllers by having both transitioning to the IDLE state, as shown in the state diagram of FIG. 16.

In FIG. 17, the TPI and TCI pad signals are bussed directly to each controller 1702, 1704, and 1706. This allows the timing of each controller to be better maintained during scan and test operations, regardless of how many controllers are hierarchically connected. If for example, the TPI and TCI signals were routed through each controller prior to being input to a lower level controller, instead of being directly input to each controller from the integrated circuit pads, delays would accumulate in the TPI and TCI signal paths as more controllers are hierarchically connected. Eventually, the accumulated delay would reach a point where the timing of scan and test operations of lower level controllers would be degraded and the controllers would no longer be synchronized to the TPI and TCI pad signals. This would cause the test hierarchy to support only a limited number of connected controllers. However, by keeping the TPI and TCI pad signals directly bussed to all controllers, and sufficiently buffered to drive all controllers, the test hierarchy would not have the stated controller connection limit.

While buffer circuitry is not shown in FIG. 17 and other figures, external signals input to the integrated circuit pads will be sufficiently buffered or otherwise amplified to allow them to drive the internal circuits they are connected to. U.S. Pat. No. 5,056,093 by Whetsel, column 20, lines 31–46, describes the advantage of directly bussing control signals.

In FIG. 17, an advantage in wire routing in the integrated circuit results from using a single TPI signal to each controller to generate a plurality of control outputs used to operate the scan distributor, scan collector, and scan path circuits. For example, if the control signals that operate the scan distributor, scan collector, and scan path circuits were not supplied by the state machine, but rather were supplied from integrated circuit pads and gated by control output from the test control register to all scan distributor, scan collector, and scan path circuits, the test control wire routing overhead in the integrated circuit would increase significantly. Furthermore, it is easier to design and route a single signal path for minimum signal degradation and skew than it is to design and route multiple signal paths for minimum signal degradation and skew. Also, it is usually preferred to keep the number of integrated circuit pads dedicated for test to a minimum number, which the single TPI signal allows.

Figure 18:
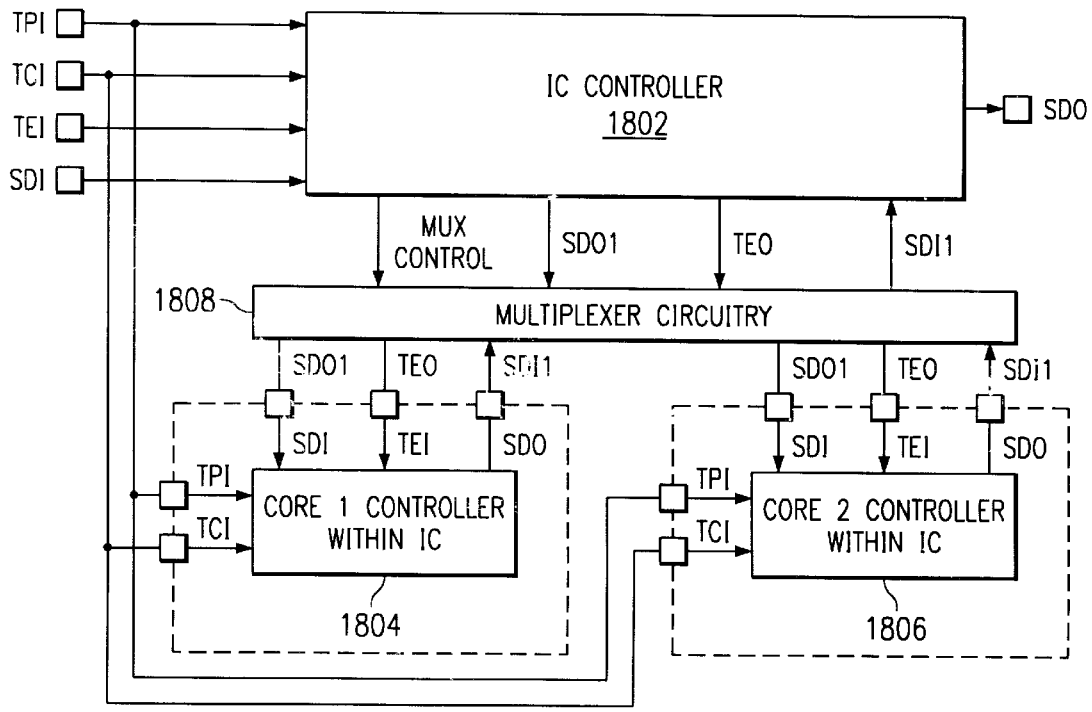
FIG. 18 is a block diagram of controllers connected in a multiplexed arrangement.

In FIG. 18, another controller connection scheme is shown. Integrated circuit 1800 provides an integrated circuit controller 1802 connected to a selected one of a plurality of controllers 1804, 1806 via multiplexer circuitry 1808. This connection scheme was previously described in regard to FIG. 12, and is used whenever the number of core terminals used for testing consume most of the available integrated circuit pads, such that no other core can be tested simultaneously due to lack of available pads. To select one of the cores 1804, 1806, the integrated circuit controller 1802 is scanned a first time to load the test control register to output mux control to the multiplexer circuitry and to insert the SDO1 and SDI1 signals of the multiplexer to the integrated circuit controller's test control register scan path. In response to the mux control output, the multiplexer circuitry; (1) connects the SDO1 output from the integrated circuit controller to the SDI input of the selected core controller, (2) connects the SDI1 input of the integrated circuit controller to the SDO output of the selected core controller, and (3) connects the TEO output of the integrated circuit controller to the TEI input of the selected core controller. The multiplexer circuitry is designed to drive the TEI inputs of non-selected cores low, so that they are held in a reset state when they are not selected by the integrated circuit controller 1802.

With this connection forming between the integrated circuit controller 1802 and the core controller, a second scan operation is performed which loads test control data into the test control registers of the integrated circuit and core controllers, to establish the test mode to be used. Following the second scan operation, the test can begin by inputting TPI control to the integrated circuit and core state machines to generate the control outputs to operate the scan distributor and scan collector architectures of the integrated circuit and core. When testing is complete, a third scan operation is used to deselect the core controller from the integrated circuit controller. If another core needs to be tested, the above sequence can be repeated to select, setup, and test the other core. If no other core needs to be tested, the TEI signal can be taken low to reset and disable all the controllers within the integrated circuit 1800, and the multiplexer circuitry 1808.

In FIG. 18, the TPI and TCI signals are bussed directly from the integrated circuit pads to the controllers to provide the timing and signal integrity advantage previously mentioned in regard to FIG. 17. While the TPI and TCI signals could be connected to the selected core via the multiplexer circuitry 1808, as shown in FIG. 12, a directly bussed connection is preferred to avoid the delay introduced by the multiplexer circuitry. If the selected core contains further embedded cores, those cores can be selected, setup, and tested using the hierarchical connection approach described in regard to FIG. 17.

Figure 19:
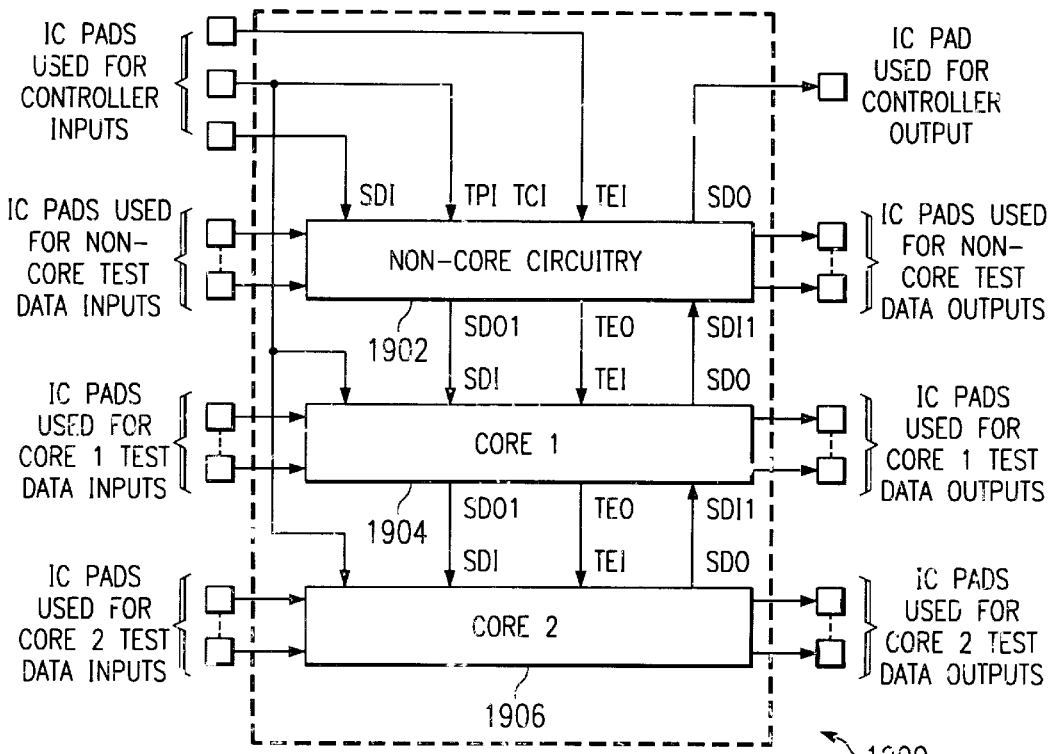
FIG. 19 is a block diagram of controllers arranged in parallel.

The structures depicted in FIG. 19 relates to the structures depicted in previous FIG. 14 where multiple cores and non-core circuits were described being directly connected to integrated circuit pads and tested in parallel. The difference between the structures of FIGS. 14 and 19 is that in FIG. 14 each circuit's controller was connected to separate integrated circuit pads to allow each controller to be independently controllable, whereas in FIG. 19, all controllers 1902, 1904, and 1906 are connected in the hierarchical fashion described in regard to FIG. 17 to allow one set of integrated circuit pads to control all circuit controllers. The process for setting up the hierarchically arranged controllers is the same as described in regard to FIG. 17.

A difference between FIG. 17 and 19 is that in FIG. 17 the test data input to and output from each circuit passes through a serial pipeline connection formed via the circuit's scan distributor and scan collector circuits, as seen in FIG. 10. In FIG. 19 the test data input to and output from of each circuit's scan distributor and scan collector circuits is provided by direct connection to integrated circuit pads. If the cores of FIG. 19 contain embedded cores, hierarchical testing as described in regard to FIGS. 10 and 17 can be performed. During scan and test operations, all controllers operate synchronous to the TPI and TCI pad inputs, which are shown directly connected to each controller.

Pipelining Test Data through Scan Distributor and Scan Collector Circuits

It is important to note that when multiple levels of scan distributor and scan collector circuits are connected to form deep serial test data input and output pipelines, as depicted to FIGS. 8, 10 and 11, the controller associated with each scan distributor, scan collector, and scan path circuit level can be setup, by scanning of the controller's test control register of FIG. 15A, to control the operation of the scan distributor, scan collector, and scan path circuits. As mentioned in regard to FIGS. 8, 10, and 11, the controllers at each level can setup their scan distributor, scan collector, and scan path circuits for testing, or the controllers can setup their scan distributor and scan collector circuits as pipeline registers to transfer test data between integrated circuit pads and scan distributor, scan collector, and scan path circuits that are setup for testing. If scan distributor and scan collector circuits are being used as pipeline registers, the controller associated with the scan distributor and scan collector circuits does not output the CPC control signal previously described in FIGS. 15A and 16. The CPC signal causes the scan collector to capture data from the scan paths. When pipelining data through the scan collector to be output from an integrated circuit pad, the data must not be overwritten, as would occur if the CPC signal were output. The following example is given to illustrate how data pipelining preferably works when intermediate scan distributor and scan collector circuits, not being used for testing, exists between a tester and scan distributor, scan collector, and scan path circuits that are being used for test.

In FIG. 11, the level 4 scan distributor, scan collector, and scan path circuits have been setup for testing and the scan distributor and scan collector circuits at levels 1–3 have been setup for pipelining data between a tester contacting the integrated circuit pads and the level 4 scan distributor, scan collector, and scan path circuits. The following steps are performed during this test.

The first step is to input 40 bits of data into the four serially connected 10-bit scan distributors and output 40 bits of data from the four serially connected 10-bit scan collectors during the SHDC state (see FIG. 16 for all state references). After this first step, the level 4 scan distributor is loaded with the first 10 bit data pattern to be shifted into the level 4 scan paths during the SHPSP state. Also following this first step, the level 1–3 scan distributors have been loaded with the next three 10 bit patterns that will eventually be shifted into the level 4 scan distributor and transferred into the level 4 scan paths.

The second step is to transfer the 10-bit pattern from the level 4 scan distributor into the scan paths during the SHPSP state, then capture the 10-bit data output from the scan paths into the level 4 scan collector during the CPC state. Note that since level 1–3 scan collectors have been setup to operate as pipeline registers, their controllers do not output the CPC control during the CPC state. As previously mentioned, outputting CPC control to level 1–3 scan collectors would overwrite data being pipelined to the tester from the level 4 scan collector circuit.

The third step is to input 10 bits of data into the four serially connected scan distributors, and output 10 bits of data from the serially connected scan collector circuits in the SHDC state. Following this step, the level 1 scan distributor contains a new 10 bit data pattern from the tester, the level 2 scan distributor contains the 10 bit data pattern previously in the level 1 scan distributor, the level 3 scan distributor contains the 10 bit data pattern previously in the level 2 scan distributor, and the level 4 scan distributor contains the 10 bit data pattern previously in the level 3 scan distributor. Also following this step, the tester contains the 10 bit data pattern previously in the level 1 scan collector, the level 1 scan collector contains the 10 bit data pattern previously in the level 2 scan collector, the level 2 scan collector contains the 10 bit data pattern previously in the level 3 scan collector, and the level 3 scan collector contains the 10 bit data pattern previously in the level 4 scan collector.

Following the third step, the second step is repeated, then the third step is repeated. This sequence of repeatedly doing the second and third steps continues until the level 4 scan paths are filled with data, at which time a fourth step of capturing data into the level 4 scan path during the CPPSP state occurs. Following the fourth step, the sequence of repeatedly doing the second and third steps continues, periodically performing the fourth step as the level 4 scan paths fill with data. Eventually the test is complete and the controllers are transitioned back into their RESET states. Note that the last scan distributor and scan collector shift operation in the third step needs to be of sufficient duration to allow the last data captured into the level 4 scan collector from the scan paths to be communicated to the tester.

What is important understand in the above example is the ability of non-testing scan distributor and scan collector circuits, located between a tester and testing scan distributor and scan collector circuits, to serve as pipeline registers which provide temporary storage for data being transferred between the tester and testing scan distributor and scan collector circuits. For example, in step one above the tester had to initially transfer 40 bits of data into and out of the level 1–4 scan distributor and scan collector circuits, to get the first 10 bit data input and output pattern to and from the level 4 scan distributor and scan collector circuits. If the level 1–3 scan distributor and scan collector circuits could not be controlled to operate in the pipeline mode, this 40 bit transfer would have to occur each time a new 10 bit data input and output pattern is required to be transferred between the tester and level 4 scan distributor and scan collector circuits. In this example, this would extend the test time by approximately a factor of 4. However, since the level 1–3 scan distributor and scan collector circuits can be controlled to operate in a pipeline mode during steps 2 and 3, the tester only has to communicate 10 bits of data during each SHDC state. Again, the key to this is the ability to scan the test control registers of the level 1–3 controllers to cause their state machines to not output the CPC control signal during the CPC state.

While this example uses a 40 bit deep pipeline, other examples may have shorter or longer pipelines, depending upon the depth of the scan distributor and scan collector test hierarchy being tranversed. Using the pipelining approach described above advantageously cancels out the depth of any scan distributor and scan collector test hierarchy, and enables the tester to be viewed as being directly connected to the testing scan distributor and scan collector circuitry, regardless of the pipeline bit length between the tester and testing scan distributor and scan collector circuitry. Being able to test a circular, a core for example, embedded N levels deep in approximately the same amount of time as it would take to test the same circuit in a non-embedded or direct fashion is a very important aspect of the present invention.

Another important aspect of the pipelining capability is the fact that the test patterns used to test the embedded circuit in the example above, are the same test patterns used to test the same circuit if it were not embedded. The only difference in the test patterns is that they must be temporarily registered along the additional non-testing scan distributor and scan collector circuits prior to being input and output to the target circuit being tested via the testing scan distributor and scan collector circuits.

Test Pattern Formatting

In conventional scan path design, test patterns are formatted to allow a tester to scan directly into and out of a scan path, as described in regard to FIG. 2. However, using the present invention the test patterns need to be formatted differently to allow navigating the test patterns through scan distributor and scan collector circuits located between the tester and scan paths.

In FIG. 20A, system 2000 provides an integrated circuit 2002, a tester driver 2004 and a tester receiver 2006. Integrated circuit 2002 contains a simplified example of a pair of scan paths, scan path 1 2008 and scan path 2 2010, interfaced to the tester driver and receiver channel by 2 bit deep scan distributor and scan collector circuits 2012, 2014. While the ideal case would be for all scan paths to be of the same bit length, that may not always be the case. To illustrate how scans to different length scan paths are performed using the present invention, scan path 1 is shown being 5 bits long and scan path 2 is shown being 4 bits long. The tester driver 2004 comprises a shift register means 2016 for transmitting data to the scan distributor and scan paths, a memory means 2018 for storing data transmitted by the shift register, and a control means 2020 for regulating the operation of the shift register and memory. The tester receiver 2006 comprises a shift register means 2022 for receiving data from the scan collector and scan paths, a memory means 2024 for storing data received by the shift register, and a control means 2026 for regulating the operation of the shift register and memory.

To support the scan distributor circuit interface between the tester and scan paths, the data stored in the driver memory is formatted into left and right columns. In the driver memory 2018, the data shown in the left column (D1–D5) is the data that would normally be shifted into scan path 1, if scan path 1 was conventionally connected directly to a tester driver. Similarly, the data (D1–D4) in the right column of the driver memory is the data that would normally be shifted into scan path 2, if scan path 2 was conventionally connected directly to another driver. However, since scan path 1 and scan path 2 are interfaced to the same tester driver, via scan distributor, the data output to scan path 1 and scan path 2 is formatted into left and right columns as shown.

To support the scan collector circuit interface between the tester and scan paths, the data stored in the receiver memory is formatted into left and right columns. In the receiver memory 2024, the data shown in the right column (D1–D5) is that data that would normally be shifted out of scan path 1, if scan path 1 was conventionally connected directly to a tester receiver. Likewise, the data (D1–D4) in the left column of the receiver memory is the data that would normally be shifted out of scan path 2, if scan path 2 was conventionally connected directly to another tester receiver. However, since scan path 1 and scan path 2 are interfaced to the same tester receiver, via scan collector, the data input from scan path 1 and scan path 2 is formatted into left and right columns as shown.

In operation, the driver's controller loads the shift register with the first row of left and right column data, i.e. D5 and X, from the driver memory. The controller then causes the shift register to shift the left and right column data (D5 and X) into the scan distributor, such that X inputs to scan path 2 and D5 inputs to scan path 1. The scan paths are then shifted to input the D5 and X. Next, the second row of left and right column data in the memory, D4 and D4, is similarly loaded into the shift register, shifted into the scan distributor, then shifted into the scan paths. This process repeats with subsequent rows of left and right column data until the scan paths have been filled, such that scan path 1 contains D1–D5 and scan path 2 contains D1–D4. The X bit in the first row of data shifted out is a placeholder that serves to pad or balance the data being shifted into the uneven length scan paths. If the scan paths had even lengths, the X would not be required.

Simultaneous with the above described driver operation, the receiver's controller operates the receiver shift register to shift in data from the scan collector, as scan distributor is being shifted, such that data that has been captured into scan collector from scan path 1 is stored into the right column of the receiver memory and data that has been captured into scan collector from scan path 2 is stored into the left column of the receiver memory. At the end of the above described driver output operation, where its memory has output rows of left and right column data to the scan distributor, the receiver memory will have filled with rows of left and right column data from the scan collector. The left column of the receiver memory is filled with scan path 2 data (D1–D4), and the right column is filled with scan path 1 data (D1–D5). Again due to the uneven length between scan path 1 and scan path 2, the last data input to the left column of the receiver memory from scan path 2 will be X. With even length scan paths, no X's would be input to the receiver memory.

After the above described shift in and out sequence occurs, the next formatted data to be shifted out to the scan paths is available in the driver memory, and new locations of receiver memory are available for storing data shifted out of the scan paths during the next sequence.

Figure 20B:
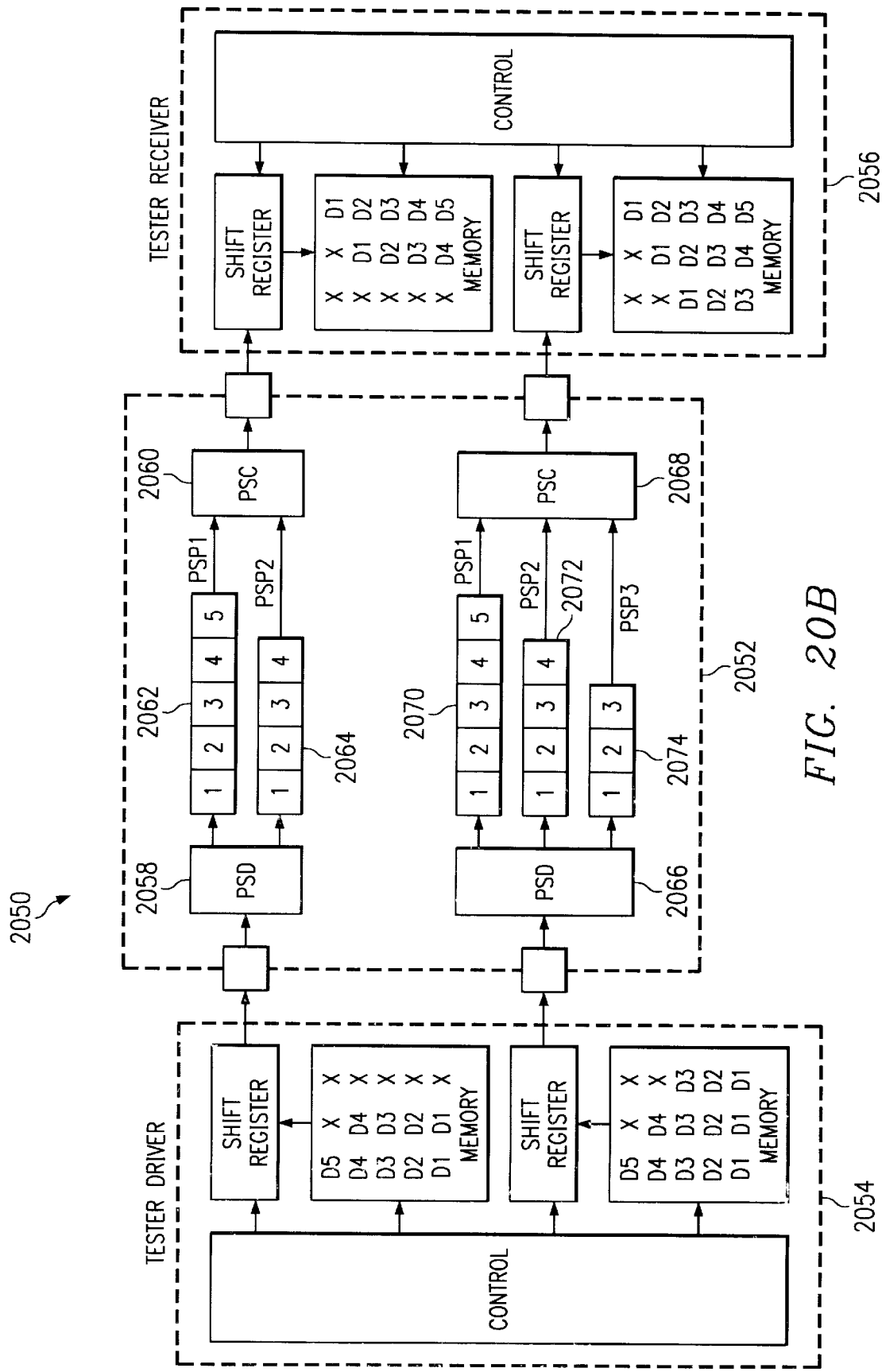

In FIG. 20B, system 2050 provides an integrated circuit 2052, tester driver 2054 and tester receiver 2056. This embodiment illustrates another example of data formatting where the tester must communicate with scan distributors and scan collectors pairs of uneven length. Scan distributor 2058 and scan collector 2060 pair connect to two scan paths 2062 and 2064, as described above. Scan distributor 2066 and scan collector 2068 pair connect to three scan paths 2070, 2072, and 2074, each having different lengths. The basic operation is the same as described in FIG. 20A, with the exception that a third column of data must be formatted for the driver and receiver memories. This third column is used for inputting and outputting data to the third scan path 2074 of the scan distributor and scan collector pair 2066, 2068. While the scan distributor and scan collector pair 2058, 2060 does not have a third scan path to communicate to, its driver and receiver memories are formatted to include a third column of X's to pad or balance the data input and output communication of the scan distributor and scan collector pairs 2058, 2060 and 2066, 2068. So, while uneven length scan paths require padding bits as described in regard to FIG. 20A, uneven length scan distributor and scan collector pairs require padding columns as depicted in FIG. 20B. It is important to note that even though the scan distributor and scan collector pair 2058, 2060 is not testing as efficiently as it was in FIG. 20A due to the additional shifts required for the X bits and X columns, it is testing while the scan distributor and scan collector pair 2066, 2068 is testing.

Power Reduction Advantage

During scan testing, conventional scan paths, as described in regard to FIG. 2, shift data in and out at the frequency of the scan clock. As previously described in regard to FIG. 4, a scan path inputs data to and receives data from combinational logic being tested. Thus, in a conventional scan path, as data shifts through the scan path the inputs to the combinational logic from the scan path may transition at the scan clock frequency. Transitioning the inputs of the combinational logic consumes power which produces heat in the integrated circuit. The amount of power consumed is related to the frequency of the input transitions to the combinational logic, which is related to the scan clock frequency shifting data through the scan path.

In FIG. 21A, integrated circuit 2100 includes a section of a scan distributor 2102 and scan collector 2104 circuit connecting two scan paths 2106, 2108. The scan paths input data to and receive data from combinational logic 2110, via functional input (FI) and functional output (FO) signals. Each scan path comprises a series of connected conventional scan cells, as shown in FIG. 21B. In the scan paths, the dotted boxes indicate the presence of the scan cell and the connection of the scan cells to each other, via serial input (SI) and serial output (SO), and to the combinational logic, via FI and FO. The test mode operation of the FIG. 21B scan cell to capture FI data and shift data from SO to SI is well known in the art of scan testing. While only two scan paths are shown in FIG. 21A, the scan distributor and scan collector circuits may be connected to many additional scan paths, each scan path being similarly connected to combinational logic via FI and FO.

In FIG. 21A, each scan cell provides outputs to the combinational logic, via FO, and to the next scan cell's SI input, via SO, except for the last scan cell which outputs to the combinational logic and the scan collector. FO and SO are the same node. There are techniques used to isolate FO and SO during scan so that FO is static while SO outputs. However, these techniques require adding and inserting circuitry, such as latches or gates, in the FO signal path between the scan cell output and input to the combinational logic and controlling the added circuitry to update at the end of each scan operation. Examples of such isolation circuitry is described in IEEE 1149.1 standard. The first scan cell's SI input is connected only to the scan distributor 2102. Each FO to the combinational logic is shown fanned out to many combinational logic inputs, which is typical. Capacitor C1 represents the capacitive load of the SI input of the scan cell driven by the scan distributor. Capacitor C2 represents the capacitive load of combinational logic inputs driven by FOs. Capacitor C3 represents the combined capacitive load associated with the all gate interconnects within the combinational logic. Capacitance C1 is small compared to capacitances C2 and C3.

If the scan paths 2106, 2108 were connected to integrated circuit pads as conventional scan paths, instead of to scan distributor and scan collector circuits, they would scan data at the scan clock input frequency. If the scan clock frequency were 100 MHz, and alternating data bits were shifted through the scan path during each scan clock period, the FO outputs from the scan paths would transition at 100 MHz. This means that each C2 combinational logic input load would charge and discharge at that frequency. Also, the capacitance C3 gate interconnect load will charge and discharge in response to the transitions at the combinational logic inputs. The power consumed during test by the charging and discharging of capacitances C2 and C3 increases as scan clock frequency increases and decreases as scan clock frequency decreases.

When using the scan distributor and scan collector circuits 2102, 2104 to scan data through the scan paths, the power consumed during test is reduced, compared to the conventional scan description above, since the scan clock frequency of the scan path circuits is reduced. For example, operating 10 bit scan distributors and scan collectors 2102, 2104 using a 100 Mhz clock and according to the previously described inner loop of the controller state diagram of FIG. 16 (i.e. the state transition loop from the CPC state to the SHDC state to SHPSP state and back to CPC state) will result in transitioning through the SHPSP state once every twelve 100 Mhz clock cycles. Since SHPSP is the state that scans data into scan paths 2106, 2108 from the scan distributor 2102, the scan paths are scanned at frequency of 100 Mhz/12 or 8.3 Mhz. Charging and discharging the capacitances C2 and C3 loads at this slower frequency reduces the power consumed during test. Operating the scan distributor at 100 MHz will cause the capacitance C1 load it drives to charge and discharge at 100 MHz, but since capacitance C1 is small compared to capacitances C2 and C3, the power consumed is negligible. Also, as previously described in regard to FIG. 6, the test time is not significantly decreased when using the scan distributor and scan collector circuits 2102, 2104 since an amplified number of smaller length scan paths are capable of being used to transmit test data to and from combinational logic being tested.

The following example illustrates the power reduction possible using scan paths connected to 10 bit scan distributors and scan collectors as shown in FIGS. 4 and 21A, rather than using conventional scan paths connected to pads as shown in FIG. 2. The power consumed by C2 and C3 of combinational logic 2100 if connected to conventional scan path 1 200 of FIG. 2 during scan operations can be estimated by; $P=CV^2F$, where C is the lumped combinational logic C2 and C3 capacitance described in FIG. 21A, V is the IC voltage, and F is the frequency of the scan path FO outputs. The power consumed after modifying scan path 1 of FIG. 2 into a group of 10 shorter length scan paths of FIGS. 4 and 21A and connecting them to 10 bit scan distributors and scan collectors, as described in regard to FIG. 3, can be estimated by; $P=CV^2(F/12)$, where C is again the lumped combinational logic C2 and C3 capacitance, V is again the IC voltage, and (F/12) is the scan frequency of the modified scan path FO outputs (i.e. (F/12) is the frequency of SHPSP state transitions in the inner loop as described above).

From this example it is seen that for a given C, V, and F, the power consumed by combinational logic 2110 being scan tested using scan paths modified for connection to scan distributor and scan collector circuits of FIGS. 4 and 21A is approximately 1/12 the power consumed by the same combinational logic 2110 if it were scan tested using the conventional scan path arrangement of FIG. 2.

It is important to note that test power consumption decreases further as the depth of the scan distributor and scan collector increases, since the frequency of the SHPSP state in the inner loop of FIG. 16 state diagram decreases. For example, with 40 bit deep scan distributors and scan collectors connected to forty 25 bit scan paths, appropriately modified from the FIG. 2 scan path as described in FIG. 3, the power can be estimated by; $P=CV^2F/42$, where F/42 is the frequency of the scan paths FO outputs (i.e. the frequency of the SHPSP state of the inner loop of FIG. 16). From this example it is seen that the power consumed by combinational logic 2110 being scan tested using 40 bit scan distributors and collectors and appropriately modified scan paths is approximately 1/42 the power consumed by the same combinational logic 2110 if it were scan tested using the conventional scan path arrangement of FIG. 2.

It is also important to note that as the depth of scan distributors and scan collectors increase, the scan cycle time of scan distributor and scan collector arrangements approach the scan cycle time of conventional scan path arrangements, as described previously in regard to FIGS. 4 and 6 above. Therefore increasing the depth of scan distributors and scan collectors advantageously reduces both IC test power consumption and IC test time.

Figure 22B:
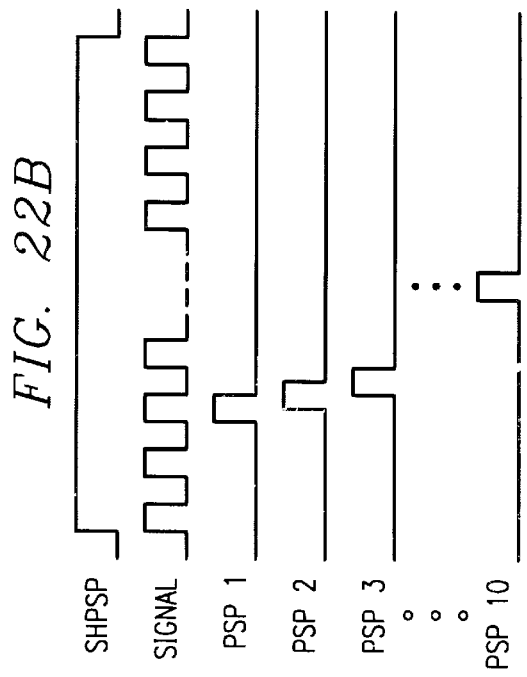
FIGS. 22A and 22B are, respectively, a block diagram of a serial connection of clock signals and a timing diagram of the clock signals occurring in series.
Figure 22A:
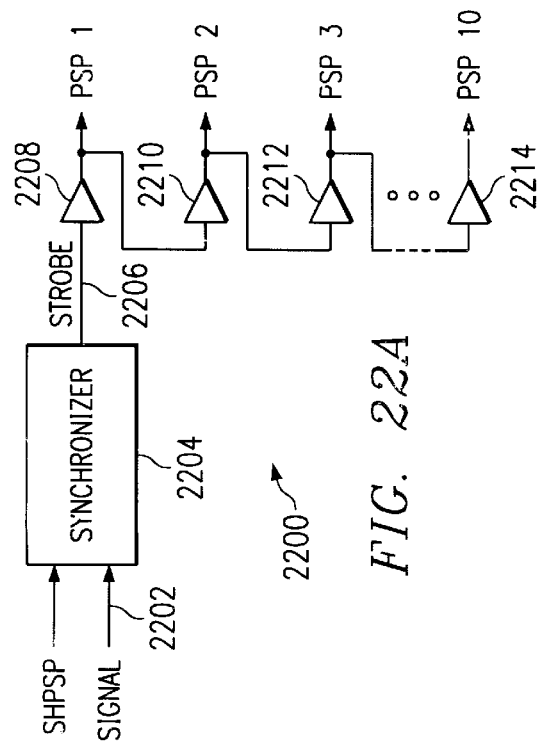

In FIG. 22A, arrangement 2200 is used to further reduce the power consumed during testing. In the description of FIGS. 21A and 21B the transitioning of the scan path's FO outputs was described to occur in response to a single scan clock used to shift data through the scan path. Using the same scan clock to shift data through all scan paths causes simultaneous transitions on the FO outputs of all the scan paths. This causes all the capacitive C2 and C3 loads driven by FO outputs to be charged or discharged simultaneously, which will consume the most power.

As described previously in regard to FIGS. 15A and 16, the SHPSP state outputs a SHPSP signal which can either shift the scan paths directly or serve as a timing window to enable another signal to shift the scan paths. The example in FIG. 22A provides for the SHPSP signal to be used as a timing window to allow another signal to produce a strobe that clocks the scan path circuits. The SHPSP and other signal 2202, a functional clock for example, are input to a synchronizer circuit 2204. The synchronizer is enabled by SHPSP being high to allow one of the clock pulses of the other signal to pass through to the synchronizer's strobe output. Note that the design of the synchronizer only allows one clock pulse to be output on the strobe output 2206 even though the signal produces multiple clock pulses during the SHPSP timing window (i.e. while SHPSP is high). In other states, such as SHDC, where the state machine remains for longer than one TCI clock, a new timing window will be produced for each TCI clock that occurs during the state. However, as described above, only one strobe output will be produced within each new timing window.

If the strobe were directly input to all scan paths, all the scan paths would shift at the same time. This would produce the simultaneous charge or discharge situation mentioned above. To prevent this, the strobe is input to a series of buffers 2208, 2210, 2212, and 2214 connected such that the output of the first buffer drives scan path 1 and the input of the second buffer, the second buffer drives the input of scan path 2 and the input of the third buffer, and so on until the last buffer drives only the last scan path.

The power reduction made possible by the scan distributor and scan collector architecture alone, or in combination with the synchronizer and delay circuitry described in FIG. 22A, enables more circuits in an IC to be tested in parallel. For example, if an IC contains multiple circuits to be tested, it is preferable to test all the circuits in parallel to reduce the IC's test time, which reduces wafer and IC manufacturing cost. However, if each circuit uses conventional scan design it may not be possible to test all circuits in parallel since the power consumed by simultaneously testing all circuits may exceed the ICs power handling capacity. Therefore, using conventional scan design, the test time of an IC may increase since circuits in the IC may need to be tested one at a time to limit the test power consumption. However, using the scan distributor and scan collector architecture it may be possible to test all circuits in an IC in parallel and therefore reduce IC test time, which reduces costs.

FIG. 22B depicts the timing of these series connected signals.

Each scan distributor and scan collector pair could have its own synchronizer and clock skewing buffer arrangement 2200, or one synchronizer and clock skewing buffer arrangement could be used for all scan distributor and scan collector pairs. Alternately, one synchronizer could be used to provide a common strobe signal to multiple clock skewing buffer arrangements. Using this approach, the shifting of data through each scan path will be staggered in time. Therefore the transitions on the FO outputs of each scan path will be staggered in time, as will the charging and discharging of capacitances C2 and C3 driven by the FO outputs. Simultaneous power consumption will therefore be reduced.

While the example circuit of FIG. 22A is shown producing skewed strobe outputs to reduce the simultaneous power consumed by the scan paths in a given test timing window, the circuit could also be used in normal functional operation to reduce simultaneous power consumed by functional registers in a given functional timing window.

Test Controller Programming for Optimized Testing of Particular Circuits

It is important to note that while the scan distributor and scan collector architecture has been shown testing combinational logic, other types of circuits can be tested as well, including memories, such as RAMs, and mixed signal circuits, such as digital to analog converters (DAC) and analog to digital converters (ADC). The following examples illustrate how the testing of other types of circuits is accomplished using the scan distributor and scan collector architecture.

Improved Testing of Embedded Memory Cores

Figures 2, 23A:
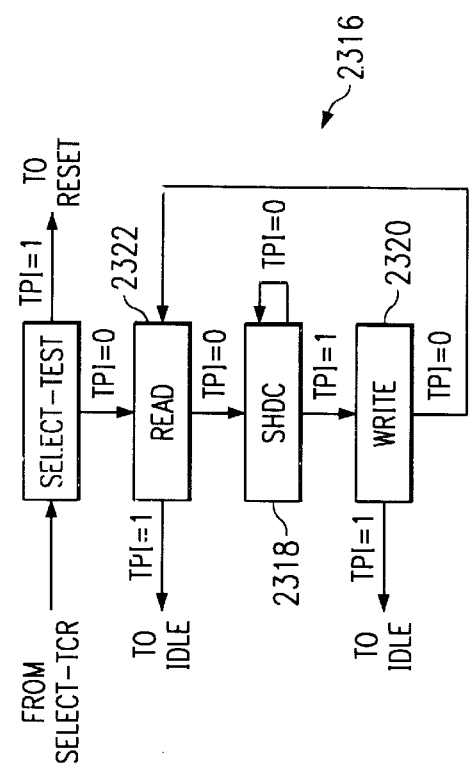

In FIG. 23A-1, integrated circuit 2300 includes a RAM memory 2302 connected, in test mode, to two scan distributor circuits 2304, 2306 and a scan collector circuit 2308. The scan distributor and scan collector circuits are connected, in test mode, to integrated circuit pads or core terminals 2310, 2312, 2314. One of the scan distributor circuits 2304 provides data input (DI) to the RAM and the other scan distributor circuit 2306 provides address input (AI) to the RAM. The scan collector circuit 2308 provides data output (DO) from the RAM.

FIG. 23A-2 shows how the SELECT-TEST portion 2316 of the state diagram of FIG. 16 is programmed to operate when testing the RAM. The programming control of the state machine is input to the state machine from the test control register, as mentioned previously in regard to FIG. 15A.

While many types of RAM test sequences can be programmed into the state machine, this test is programmed to repeat the steps of addressing the RAM, writing data to the addressed location, then reading back the data written into the addressed location. At the beginning of the test, the state machine enters the SHDC state 2318 (from the SELECT-TEST and Read states) to shift data and address into the scan distributors, and data from the scan collector. Next, the state machine enters the Write state 2320 to store data shifted into the scan distributor into the RAM location addressed by the address shifted into the other scan distributor. Next, the state machine enters the Read state 2322 to read back the data from the addressed location into the scan collector. The data read back should equal the data written.

During the Write state the controller outputs control to the RAM to write data. During the Read state the controller outputs control to the RAM to read data and also outputs control to cause the scan collector to capture the data being read. This process of shifting the scan distributors and scan collector to input data and address to and output data from the RAM, in combination with appropriately controlling the RAM to write and read data, repeats until all RAM locations have been written to and read from. The test can repeat with another set of data to be written and read into each address.

Improved Testing of Embedded Mixed Signal Cores

Figures 1, 23A:
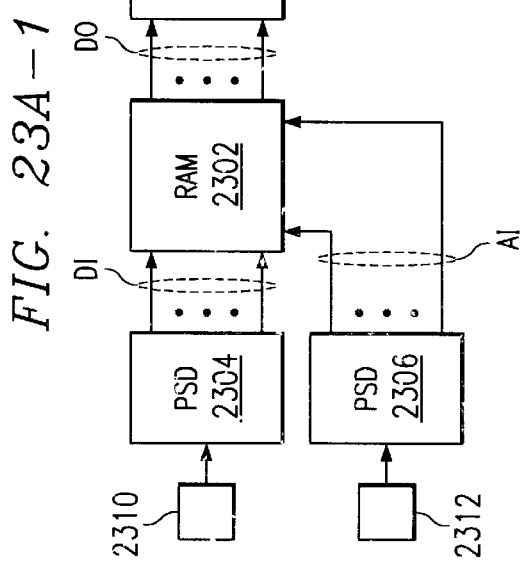
Figures 1, 23B:
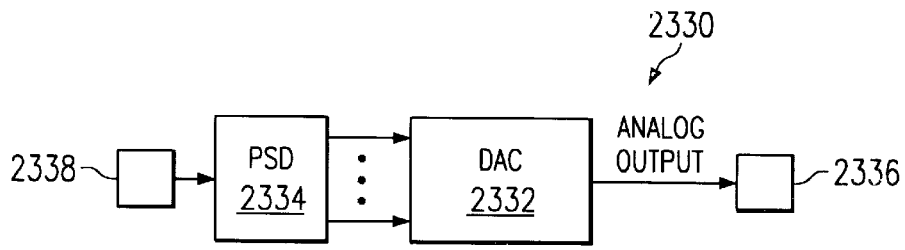
Figures 2, 23B:
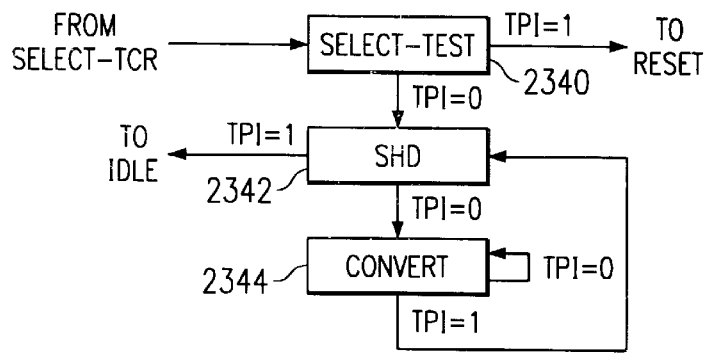

In FIG. 23B-1, an integrated circuit 2330 includes a digital to analog converter (DAC) 2332 connected, in test mode, to a scan distributor circuit 2334 at its digital input and to an integrated circuit pad or core terminal 2336 at its analog output. The scan distributor circuit 2334 is connected, in test mode, to an integrated circuit pad or core terminal 2338. The scan distributor circuit 2334 provides the digital input to the DAC and the analog output provides analog output from the DAC.

FIG. 23B-2 shows how the SELECT-TEST portion 2340 of the state diagram of FIG. 16 is programmed to operate when testing the DAC.

While many types of DAC test sequences can be programmed into the state machine, this test is programmed to repeat the steps of inputting digital data to the DAC, converting the digital data into an analog output, and outputting the analog output to a tester for inspection. At the beginning of the test, the state machine enters the shift distributor state (SHD) 2342 (from the SELECT-TEST state) state to shift digital data from an external tester into the scan distributor. Next, the state machine enters the Convert state 2344 to cause the DAC to convert the digital data from the scan distributor into an analog output. The analog output is inspected by an external tester connected to the analog output pad/terminal. The state machine remains in the Convert state long enough for the conversion to take place and for the tester to inspect the analog output, then enters the SHD state to load the next digital input to be converted into analog output and inspected. This process repeats until all digital input codes have been input to the DAC and converted into analog outputs. The test can repeat with a different sequence of digital inputs if desired.

Figures 1, 23C:
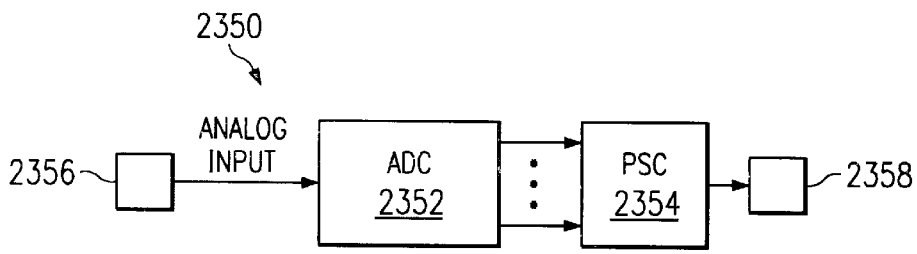
Figures 2, 23C:
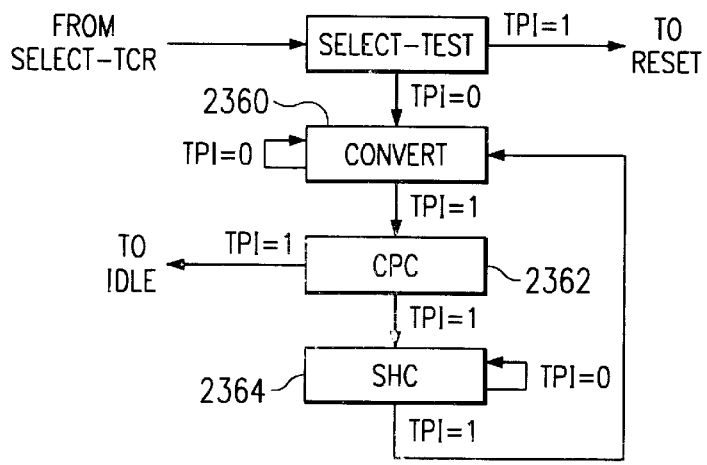

In FIG. 23C-1, an integrated circuit 2350 includes an analog to digital converter (ADC) 2352 connected, in test mode, to a scan collector circuit 2354 at its digital output and to an integrated circuit pad or core terminal 2356 at its analog input. The scan collector circuit is connected, in test mode, to an integrated circuit pad or core terminal 2358. The scan collector circuit 2354 provides digital output from the ADC and the analog input provides analog input to the ADC.

FIG. 23C-2 shows how the SELECT-TEST portion of the state diagram of FIG. 16 is programmed to operate when testing the ADC.

While many types of ADC test sequences can be programmed into the state machine, this test is programmed to repeat the steps of inputting analog input to the ADC, converting the analog input into a digital output, and outputting the digital output to a tester for inspection. At the beginning of the test, an analog input from an external tester is input to the ADC via a pad/terminal. Next, the state machine enters the Convert state 2360 (from the SELECT-TEST state) to cause the ADC to convert the analog input into digital output. The state machine remains in the Convert state long enough for the conversion to take place. Next, the state machine enters the CPC state 2362 to capture the digital output into the scan collector. Next, the state machine enter the shift collector (SHC) state 2364 to shift the scan collector to output the digital output to an external tester. This process repeats until all digital output codes, representative of the applied analog inputs, have been output from the ADC to the tester. The test can repeat with a different analog input signal and resulting digital outputs if desired. At the end of this and the other two test examples above, the state machine returns to either the IDLE or RESET state as shown in FIG. 16.

It is important to note in the above examples, that if the RAM, DAC, or ADC is a core embedded deep inside an integrated circuit, the previously described method of pipelining data, can be used to improve digital test data bandwidth to and from the circuits. Also note that if pipelining is used, the controllers of the intermediate scan distributor and scan collector circuits, that pipeline the data, must be programmed to operate according to the state diagrams of FIGS. 23A-1, 23B-1, and 23C-1 for synchronous operation. Further, the pipelining controllers of intermediate scan distributor and scan collector circuits must disable the capture collector signals during the read state 2322 of 23A-2 and CPC state 2362 of 23C-2 to avoid overwriting data being pipelined, as previously mentioned. As mentioned previously in regard to FIGS. 15A, 16, and 22A, the control signals output from the controllers may control testing directly or may operate as timing windows within which another signal may be enabled to control testing.

Hierarchical Routing of Analog Test Signals

While not shown in the above examples, multiplexing circuitry is provided to allow the circuits to be connected to the scan distributor, scan collector, and analog input and output signals while in test mode, and to functional inputs (FI) and outputs (FO) during normal mode, similar to that shown in FIG. 8. It is also important to note that, in the above examples, the circuits being tested are connected, in this particular test mode, directly to the scan distributor and scan collector circuits, and not through scan paths as previously described in the testing of combinational logic. Also, the internal routing of analog inputs and outputs between the external tester contacting the integrated circuit pad and a terminal to an embedded DAC or ADC should be designed carefully so that the analog signal is not significantly degraded or otherwise modified.

Figure 24:
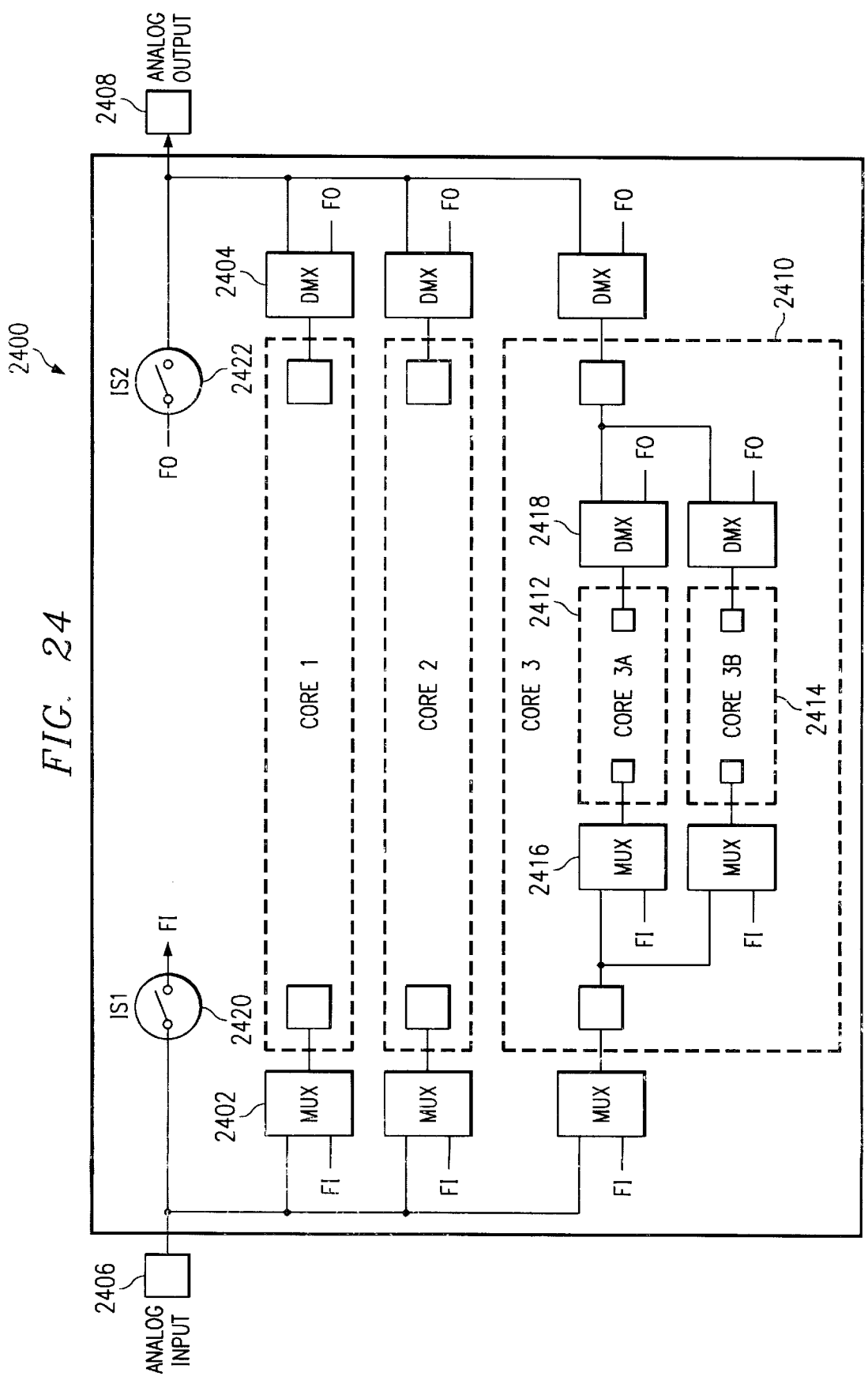
FIG. 24 is a block diagram of an integrated circuit with mixed signal cores.

In FIG. 24, for example, the direct routing scheme described for the TPI and TCI signals in FIG. 17 can be used for routing the analog test input and output signals between integrated circuit pads 2406, 2408 and terminals 2424, 2426 of embedded mixed signal cores 1, 2, and 3 within the integrated circuit 2400. The analog multiplexer and demultiplexer circuitry, such as 2402, 2404, at the analog test input and output terminals 2424, 2426 of the cores can be controlled by the integrated circuit's controller to allow either test or functional input and output, as described in FIG. 8. The analog multiplexer and demultiplexer circuitry may be designed for bi-directional operation using transmission gates, or for unidirectional operation using buffers. When not used for outputting analog test signals, the test outputs of the demultiplexers 2404 are disabled from driving pad 2408. Core 3 2410 includes a direct routing scheme that is hierarchical to allow further connection to core 3A 2412 and core 3B 2414 within Core 3. Within Core 3, the operation of the analog multiplexers and demultiplexers 2416, 2418 of Core 3A and Core 3B are controlled by Core 3's controller, not the integrated circuit's controller.

Also in FIG. 24, integrated circuit 2400 includes isolation switches 1 and 2 (IS1 and IS2) 2420, 2422 on the integrated circuit's analog input and output pads. In normal mode, the integrated circuit's controller closes IS1 and IS2, and in test mode, the integrated circuit's controller opens IS1 and IS2. Opening IS1 in test mode isolates the pad 2406 from functional inputs (FI) it may be connected to in normal mode, which eliminates loading and prevents the analog test inputs from effecting the functional inputs (FI) of circuitry connected to the pad during normal integrated circuit operation mode. Opening IS2 in test mode isolates the pad 2408 from functional outputs (FO) it may be connected to in normal mode, which allows the analog test output from a selected core to drive out on the pad without opposition from functional outputs. While not shown, similar isolation switches exist within each embedded core. The isolation switches of each core are controlled by the core's controller.

In regard to the testing of digital circuits, similar isolation, to that mentioned above, is provided for digital test input and output as described in FIG. 14A of U.S. Pat. No. 5,606,566 to Whetsel, the patent mentioned in regard to FIG. 2. According to the present invention as described above for analog test input and output isolation, digital test input and output isolation at the integrated circuit level is controlled by the integrated circuit's controller while digital test input and output isolation at the core level is controlled by the core's controller.

Modifying the IEEE 1149.1 TAP for Use in Scan Distributor and Scan Collector Architectures The description of the scan distributor and scan collector architecture has shown how it can be used in an integrated circuit and within cores embedded within integrated circuits. Another test architecture that can be used in integrated circuits and within cores embedded within integrated circuits is the IEEE 1149.1 Test Access Port and Boundary Scan Architecture. The following description illustrates how the scan distributor and scan collector architecture and the IEEE 1149.1 architecture can be designed to coexist within an integrated circuit or within cores embedded within integrated circuits. Of particular importance is the way the IEEE 1149.1 architecture will be shown modified or improved to allow it to utilize the same test interface as is used by the scan distributor and scan collector architecture, and to use the same method of hierarchical connectivity used by the scan distributor and scan collector architecture.

Figure 25A:
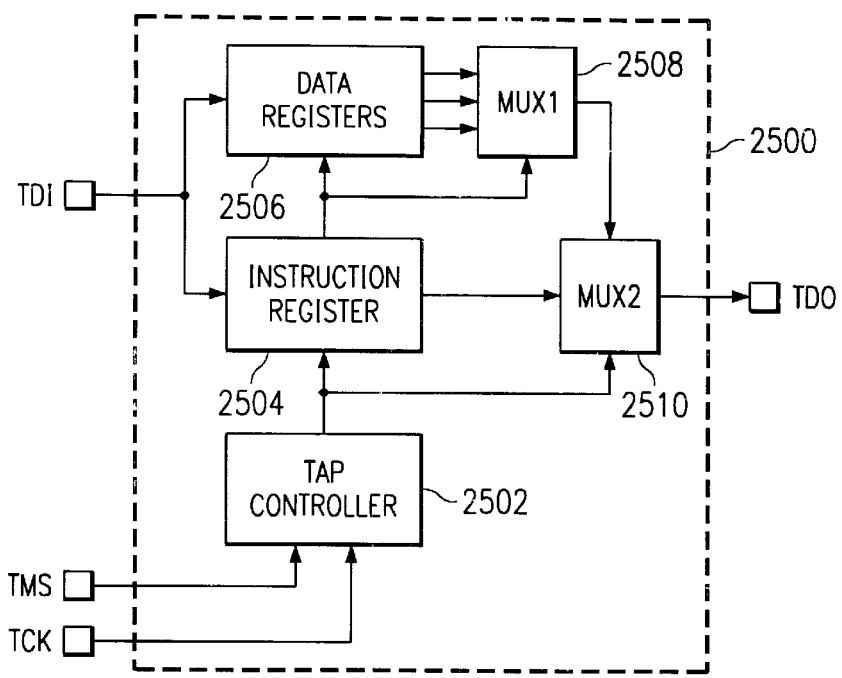
FIG. 25A is a block diagram of a conventional test access port.

In FIG. 25A, a conventional 1149.1 Test Access Port (TAP) 2500 comprises inputs and output for a test data input (TDI), test data output (TDO), test mode select (TMS), and test clock (TCK). The TAP also comprises a TAP controller state machine 2502, an instruction register 2504, a plurality of data registers 2506, multiplexer 1 (Mux1) 2508, and multiplexer 2 (Mux2) 2510. The TAP controller is connected to TMS and TCK, and responds to these signals to shift data through either the instruction register or a selected data register, from TDI to TDO. During instruction register shift operations, the TAP controller causes Mux2 to connect the output of the instruction register to TDO. During data register shift operations, the instruction loaded in the instruction register selects one of the data register outputs to be output from Mux1, and the TAP controller controls Mux2 to connect the output of Mux1 to TDO. The structure and operation of the TAP, as it will be referred to hereafter, is widely understood.

Figure 25B:
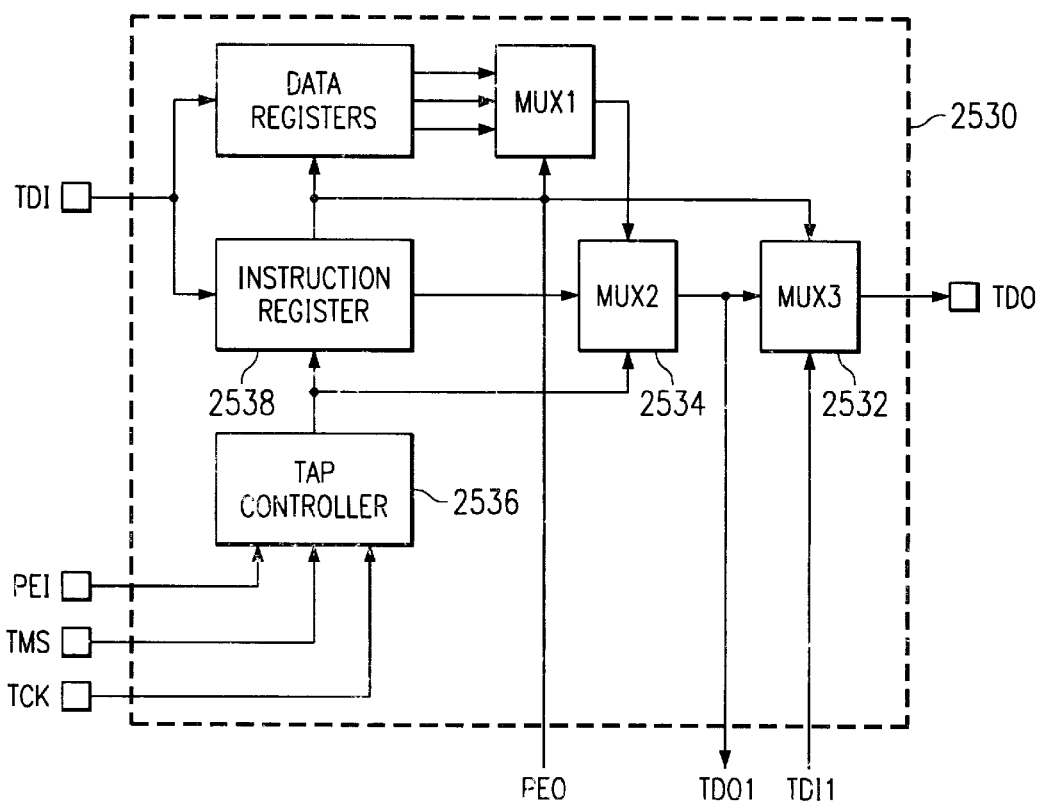
FIG. 25B is a block diagram of a modified test access port.

In FIG. 25B, a conventional TAP 2530, like the TAP 2500 of FIG. 25A, is modified to allow it to coexist and operate with the scan distributor and scan collector controller of FIG. 15A. The modifications include: (1) inserting a third multiplexer (Mux3) 2532 between the output of Mux2 2534 and TDO, which corresponds to the multiplexer in FIG. 15A; (2) providing a TDI1 input to Mux3, which corresponds to SDI1 of FIG. 15A; (3) providing a TDO1 output from Mux2, which corresponds to SDO1 of FIG. 15A; (4) providing instruction control to Mux3 to allow an instruction to select TDO1 or TDI1 to be output to TDO, which corresponds with the control output from the test control register to the multiplexer of FIG. 15A; (5) providing a port enable input (PEI) signal to the TAP controller 2536 to enable or disable the TAP, which corresponds to the TEI signal to the test control state machine of FIG. 15A; and (6) providing a port enable output (PEO) signal from the TAP's instruction register 2538 to enable lower level TAPs, which corresponds to the TEO signal from the test control register of FIG. 15A.

With these modifications, the TAP 2530 operates as the conventional TAP 2500 when enabled by PEI and while Mux3 is controlled to make a connection between Mux2 and TDO. When Mux3 is controlled by an instruction shifted into the instruction register 2538 to insert a scan path between TDO1 and TDI1 into the TAPs TDI and TDO scan path, the TAP 2530 leaves the conventional mode of operation and enters the new mode of operation made possible by the present invention.

It is important to note that control of Mux3 2532 is only possible by performing an instruction scan operation. Data scan operations through the TAP 2530 cannot modify the control of Mux3. This is an advantage since it allows the scan path length adjustment capability provided by Mux3 to take place only in response to instruction scan operations, and not during data scan operations. Also, while Mux3 is shown existing within the TAP 2530, it could exist external of the TAP as well. If it were external of the TAP, it would still be connected, as shown in FIG. 25B, to the instruction register 2538 and TDO1 and TDI1 signals.

U.S. Pat. No. 4,872,169, previously mentioned in regard to FIG. 15A, describes an adjustable length scan path architecture. In this patent, the scan path length is adjustable during each scan operation. The above mentioned method of using Mux3 2532 to adjust the scan path length only during instruction scan operations, and not during data scan operations, is novel over the mentioned patent. Also, the above improvement is novel over conventional TAPs, since conventional TAPs (FIG. 25A) do not have a Mux3 to provide the hierarchical capability to link or unlink the TDI to TDO scan path of a lower level TAP to or from the TDI and TDO scan path of a higher level TAP. Furthermore, conventional TAPs do not provide the capability of outputting PEO control from a higher level TAP to enable or disable the operation of a lower level TAP, such that when enabled the TDI to TDO scan path of the lower level TAP is included in the TDI to TDO scan path of the higher level TAP, and when disabled, the TDI to TDO scan path of the lower level TAP is excluded from the TDI to TDO scan path of the higher level TAP.

IEEE TAP Design with Instruction Adjustable Scan Length

It is important to note that while the focus of this description is the design of a TAP that can coexist within a scan distributor and scan collector architecture, the way the TAP is modified in regard to FIG. 25B to hierarchically insert or delete a lower level TAP scan path into and from a higher level TAP scan path is important independent of the scan distributor and scan collector architecture. This invention includes the modifications of the conventional TAP as depicted in FIG. 25B and the above mentioned capability to only adjust the scan path length during instruction scan operations.

The ability to enable or disable a TAP using a signal like PEI is known. A known example of how a TAP may be enabled or disabled is described in a paper entitled "An IEEE 1149.1 Based Test Access Architecture for integrated circuits with Embedded Cores" by Whetsel, published in the 1997 IEEE International Test Conference proceedings.

With the modifications described and shown in FIG. 25B, the TAP is seen to provide the same signal types as that seen in the controller of FIG. 15A. For example in comparing FIGS. 25B and 15A it is seen that PEI relates to TEI, PEO relates to TEO, TDO1 relates to SDO1, TDI1 relates to SDI1, TMS relates to TPI, TCK relates to TCI, TDI relates to SDI, and TDO relates to SDO. Further it is seen that the operation of the TAP of FIG. 25B and controller of FIG. 15A is similar. For example, (1) the TAP is enabled and disabled by the PEI signal, as the controller is enabled and disabled by the TEI signal, (2) the TAP shifts data from TDI to TDO in response to TMS and TCK, as the controller shifts data from SDI to SDO in response to TPI and TCI, (3) the TAP is initialized at reset to exclude a TDO1 to TDI1 scan path from the TDI and TDO scan path, as the controller is initialized at reset to exclude a SDO1 to SDI1 scan path from the SDI and SDO scan path, (4) the TAP's instruction register can be loaded with control to include a TDO1 to TDI1 scan path in the TDI and TDO scan path, as the controller's test control register can be loaded with control to include a SDO1 to SDI1 scan path is the SDI and SDO scan path, and (5) the TAP's instruction register can be loaded with control to exclude a TDO1 and TDI1 scan path from the TDI and TDO scan path, as the controller's test control register can be loaded with control to exclude a SDO1 and SDI1 scan path from the SDI and SDO scan path. A conventional TAP (i.e. the TAP of FIG. 25A) instruction register is designed to include an update register as shown in FIG. 15B to prevent its control outputs from changing during shift operations.

Instruction Based Data Path Length Adjustment

The circuit of FIG. 25B can be generally viewed as a data path length adjustment circuit having first and second ports. The first port has an enable input (PEI) and first (TDI) and second (TDO) nodes for communicating data. The second port has an enable output (PEO) and first (TDO1) and second (TDI1) nodes for communicating data. The first port is enabled to communicate data between its first and second nodes if the enable input is high, and is disabled from communicating data if the enable input is low. The data communicated from the first and second nodes of the first port passes through either an instruction register or a data register contained within the first port. The enable output of the second port comes from the instruction register of the first port.

A circuit connected to the second port is enabled to communicate data with the first port if the enable output from the instruction register of the first port has been set high in response to an instruction register communication. In this case, communication occurs from the first node of the first port, through the instruction or data register of the first port to the first node of the second port, through the connected circuit to the second node of the second port, and from the second node of the second port to the second node of the first port. A circuit connected to the second port is disabled from communicating data with the first port if the enable output from the instruction register of the first port has been set low in response to an instruction register communication. In this case, communication occurs only from the first node of the first port, through the instruction or data register of the first port, and to the second node of the first port.

If the circuit connected to the second port of the data path length adjustment circuit described above is another data path length adjustment circuit, it can be further connected at its second port to another circuit, which may also be a data path length adjustment circuit, and so on. This concept of adjusting the length of a data communication by communication to an instruction register is not limited to test data communication applications. It could be used in functional data communication applications as well. It is also independent of the physical implementation of the data path length adjustment circuit, which could be realized as a sub-circuit within an integrated circuit or core, or a device for use on a board or MCM. Also, while the data path length adjustment circuit has been described as having singular first and second nodes at the first and second ports, a plurality of first and second nodes on each of the first and second ports is possible to support data path length adjustment of parallel data buses as well. Furthermore, the connectivity arrangement provided by the data path length adjustment circuit could be altered from the example given without departing from the spirit and scope of the present invention.

U.S. Pat. Nos. 4,872,169 and 5,056,093, both by Whetsel, adjust the length of scan paths. U.S. Pat. No. 4,872,169 adjusts the length of scan paths by communication to a control bit contained within the scan path. U.S. Pat. No. 5,056,193 adjusts the length of scan paths by communication to a data register, following a first communication to an instruction register. The data path length adjustment method described above occurs in response to only instruction register communication.

Operating State Machines with Shared I/O

Figure 26:
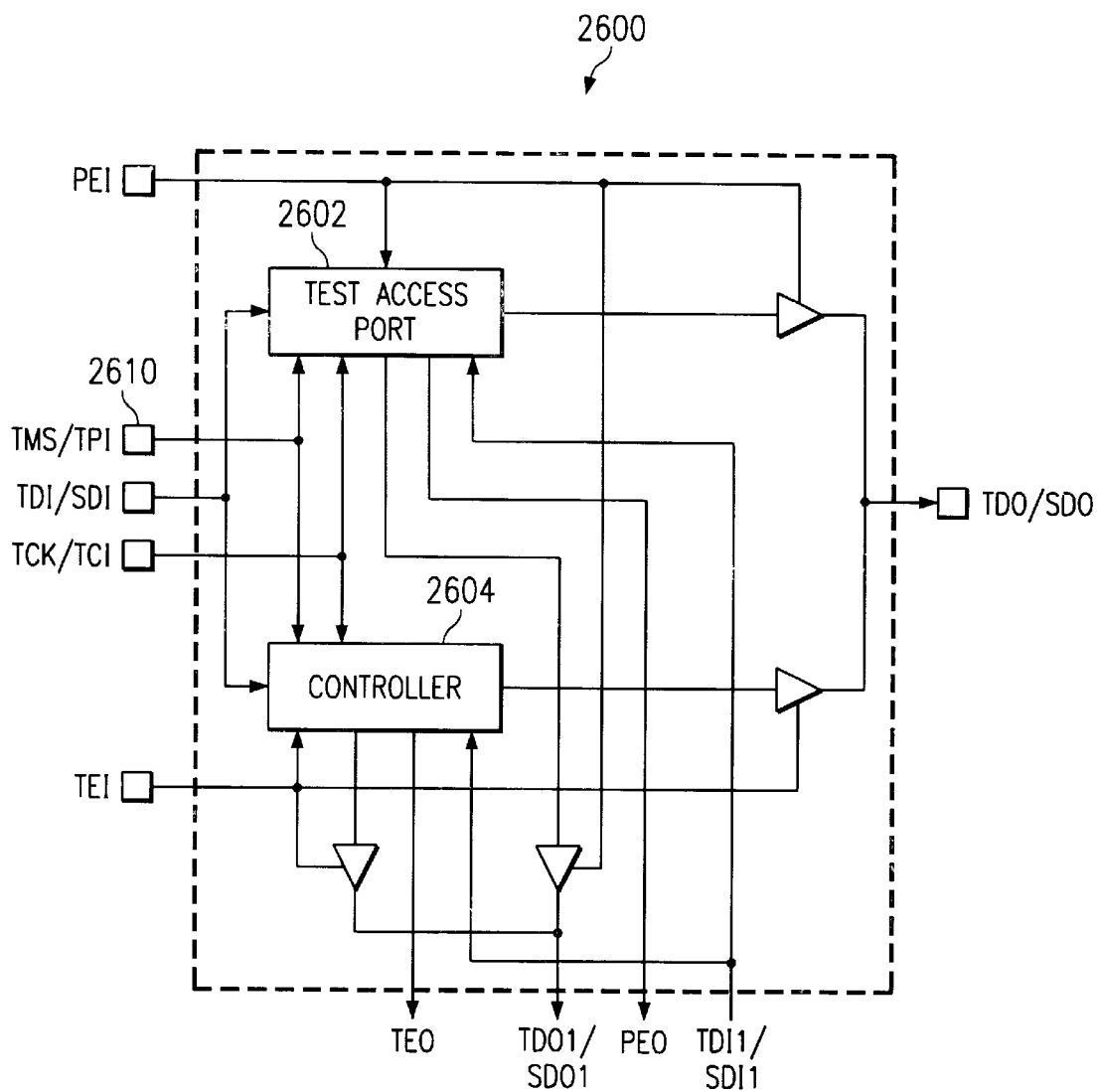
FIG. 26 is a block diagram of a modified test access port and test controller joined together.

In FIG. 26, the TAP of FIG. 25B and controller of FIG. 15A are connected to allow both to coexists together in an integrated circuit or core. In FIG. 26, circuitry 2600 includes a test access port or TAP 2602 and a controller 2604. TAP 2602 is like TAP 2530 and controller 2604 is like controller 1500. The similarities between the TAP and controller allow both to share many of the same signals. For example, the TMS and TPI control signals can be provided by a single shared TMS/TPI signal, the TCK and TCI clock signals can be provided by a single shared TCK/TCI signal, the TDI and SDI data input signals can be provided by a single shared TDI/SDI signal, the TDO and SDO data output signals can be provided by a single shared TDO/SDO signal, the TDO1 and SDO1 data output signals can be provided by a single shared TDO1/SDO1 signal, and the TDI1 and SDI1 data input signals can be provided by a single shared TDI1/SDI1 signal. The advantage of sharing these signals is that it reduces the number of integrated circuit pads, such as 2610, required to access the TAP or controller at the integrated circuit level, and also reduces wiring interconnect between integrated circuit level TAPs and controllers and embedded core level TAPs and controllers.

In FIG. 26, the PEI and TEI signals are not shared. This allows the TAP and controller to be enabled or disabled individually. If neither the TAP or controller is being accessed, the PEI and TEI signals will be set to disable them. If the TAP is being accessed, the PEI signal will enable the TAP and the TEI signal will disable the controller. If the controller is being accessed, the TEI signal will enable the controller and the PEI signal will disable the TAP. The PEO and TEO outputs from the TAP and controller respectively, are also not shared to allow individual control outputs for setting the PEI and TEI inputs of embedded, lower level TAPs and controllers. When the TAP is enabled by PEI, buffers are enabled to allow the TAP to output on the shared TDO/SDO and TDO1/SDO1 outputs. Likewise, when the controller is enabled by TEI, buffers are enabled to allow the controller to output on the shared TDO/SDO and TDO1/SDO1 output.

It is important to see in the arrangement of FIG. 26 that two state machines, i.e. TAP and controller, are connected together using shared inputs and outputs. It is further seen that each state machine can be individually enabled to operate using the shared inputs and outputs to perform a function.

Architecture Supporting Hierarchically Arranged IEEE 1149.1 TAPs

When the controller is enabled and the TAP is disabled, the controller operates as if the TAP were not present and in all the arrangements previously described in FIGS. 17, 18, and 19. For example, when the controller is enabled and the TAP is disabled, the controller can operate in the hierarchical arrangement of FIG. 17 to enable and connect up with lower level controllers. When the TAP is enabled and the controller is disabled, the TAP operates in a very similar way as previously described for the controllers in FIG. 17. For example, if the shared TAP and controller signals of FIG. 26 were substituted for the controller signals in FIG. 17, and if "integrated circuit TAP", "Core 1 TAP within integrated circuit", and "Core 2 TAP within Core 1" were substituted for "integrated circuit Controller", "Core 1 Controller within integrated circuit", and "Core 2 Controller within Core 1", respectively, the process and description of hierarchically selecting a lower level TAP by scanning a higher level TAP would follow closely that given for the controller. Summarizing, the process would be to scan the instruction register of the highest level TAP to enable a lower level TAP, then scanning through both instruction registers of both TAPs to continue enabling further lower level TAPs or to load a test instruction to execute in both TAPs.

Known operations performed by TAPs in integrated circuits and cores include; (1) testing the interconnects between plural integrated circuits on a board and plural cores within an integrated circuit, (2) testing circuitry contained within an integrated circuit or core, and (3) executing emulation and debug functions of circuitry contained within an integrated circuit or core. The ability to hierarchically access the TAPs within integrated circuits and cores, as shown in FIG. 17, to perform these types of operations is therefore an important aspect of the present invention.

I claim:

1. A controller for use in a scan distributor and scan collector architecture system comprising:

A. a test control register having an input for receiving a serial data input (SDI) and inputs for receiving control, the test control register having an output for providing a serial data output 1 (SDO1), and a control bus output that provides control;

B. a test control state machine, the state machine having inputs for receiving a test protocol input (TPI), a test clock input (TCI), a test enable input (TEI), and control inputs from the test control register control bus output, the state machine also having outputs for providing a shift distributor and collector output (SHDC), a capture collector output (CPC), a shift parallel scan path output (SHPSP), and a capture parallel scan path output (CPPSP), the state machine also having control outputs that are output to the test control register; and C. a multiplexer having control inputs from the test control register control bus output, a serial data output 1 (SDO1) input from the test control register, and a serial data input 1 (SDI1), and the multiplexer having a serial data output (SDO).

2. The controller of claim 1 including integrated circuit pads connected to the controller that carry the input and output signals to and from the controller.

3. The controller of claim 1 including core terminals that are connected to the controller and that carry the input and output signals to and from the controller.

4. The controller of claim 1 including scan distributor, scan collector, and scan path circuits that are connected to the SHDC, CPC, SHPSP, and CPPSP signals output from the controller.

5. The controller of claim 1 including a lower level controller and in which the test control register includes an output for providing a test enable output (TEO) to the lower level controller.

6. The controller of claim 1 in which the test control register includes an update register and a shift register, the shift register having a serial data input and a serial data output and receiving a reset and a clock input, the shift register connecting to the update register and the update register producing the control bus of signals.

7. The controller of claim 1 including additional controllers arranged in a hierarchy with the higher controller controlling the lower controller.

8. The controller of claim 1 including additional controllers arranged with one higher controller controlling other controllers through a multiplexer.

9. An integrated circuit including plural controllers of claim 1 in which each controller acts independent of one another.

10. An integrated circuit comprising;

a first state machine having a mode input, a clock input, and an enable input, said first state machine enabled, by a first logic state on the enable input, to transition through states in response to the mode and clock inputs, and disabled, by a second logic state on the enable input, from transitioning through states in response to the mode and clock inputs;

a second state machine having a mode input, a clock input, and an enable input, said second state machine enabled, by a first logic state on the enable input, to transition through states in response to the mode and clock inputs, and disabled, by a second logic state on the enable input, from transitioning through states in response to the mode and clock inputs;

a first connection formed between the mode inputs of the first and second state machines and a first input pad of the integrated circuit;

a second connection formed between the clock inputs of the first and second state machines and a second input pad of the integrated circuit;

a third connection formed between the enable input of the first state machine and a third input pad of the integrated circuit; and a fourth connection formed between the enable input of the second state machine and a fourth input pad of the integrated circuit.

11. A test access port circuit formed on an integrated circuit, said test access port circuit comprising;

an instruction register having a serial input connected to a first test data input terminal;

a plurality of data registers each having serial inputs connected to the first test data input terminal;

a state machine having inputs connected to a test clock input terminal and a test mode select input terminal;

a first multiplexer having data inputs, each data input connected to a serial output of one of said plurality of data registers;

a second multiplexer having first and second data inputs, said first data input connected to the output of the first multiplexer and said second data input connected to a serial output from the instruction register, said second multiplexer having a data output connected to a first test data output terminal;

a third multiplexer having first and second data inputs, said first data input connected to the output of the second multiplexer and said second data input connected to a second test data input terminal; said third multiplexer having a data output connected to a second test data output terminal.

12. The test access port circuit of claim 11 wherein the first and third multiplexers receive control input from the instruction register, and the second multiplexer receives control input from the state machine.

* * * * *